(12) United States Patent
Hu

(10) Patent No.: US 7,258,745 B2
(45) Date of Patent: Aug. 21, 2007

(54) METHOD FOR FABRICATING HAFNIA FILMS

(75) Inventor: Michael Z. Hu, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 550 days.

(21) Appl. No.: 10/913,896

(22) Filed: Aug. 6, 2004

(65) Prior Publication Data

US 2006/0030135 A1    Feb. 9, 2006

(51) Int. Cl.
C30B 29/54 (2006.01)

(52) U.S. Cl. .................. 117/925; 117/926; 117/927; 977/712; 977/721; 977/715; 977/707

(58) Field of Classification Search .......... 117/925, 117/926, 927
See application file for complete search history.

(56) References Cited

U.S. PATENT DOCUMENTS

| | | | | |
|---|---|---|---|---|
| 5,139,592 A | * | 8/1992 | Debe | 117/109 |
| 5,194,926 A | * | 3/1993 | Hayden | 257/565 |
| 5,352,485 A | * | 10/1994 | DeGuire et al. | 427/226 |
| 5,483,378 A | * | 1/1996 | Rahn | 359/586 |
| 5,545,432 A | * | 8/1996 | DeGuire et al. | 427/226 |
| 5,618,760 A | * | 4/1997 | Soh et al. | 438/703 |
| 5,997,832 A | * | 12/1999 | Lieber et al. | 423/249 |

(Continued)

OTHER PUBLICATIONS

A. Ulman, et al., "Formation and Structure of Self-Assembled Monolayers," Chem. Rev., 1996, pp. 1533-1554, vol. 96.

(Continued)

Primary Examiner—Yogendra Gupta
Assistant Examiner—G. Nagesh Rao
(74) Attorney, Agent, or Firm—Joseph A. Marasco; Shelley L. Stafford

(57) ABSTRACT

The present invention comprises a method for fabricating hafnia film comprising the steps of providing a substrate having a surface that allows formation of a self-assembled monolayer thereon via covalent bonding; providing an aqueous solution that provides homogeneous hafnium ionic complexes and hafnium nanoclusters wherein the aqueous solution is capable of undergoing homogeneous precipitation under controlled conditions for a desired period of time at a controlled temperature and controlled solution acidity for desired nanocluster nucleation and growth kinetics, desired nanocluster size, desired growth rate of film thickness and desired film surface characteristics. The method further comprising forming the self-assembled monolayer on the surface of the substrate wherein the self-assembled monolayer comprises a plurality of hydrocarbon chains cross-linked together along the surface of the substrate, the hydrocarbon chains being uniformly spaced from one another and wherein each of the hydrocarbon chains having a functional anchoring group at a first end of the chain covalently bonded with the surface of the substrate and each of the hydrocarbon chains having a functional terminating group projected away from the surface wherein the functional terminating group provides a bonding site for the hafnium film to grow; and exposing the substrate to the aqueous solution for a desired period of time at a controlled temperature wherein the hafnium ionic complexes and the hafnium nanoclusters are deposited on the bonding site of the functional terminating group thereby forming the hafnia film wherein the hafnium bonded to the hydrocarbons and to one another provide a uniform ordered arrangement defined by the uniform arrangement of the hydrocarbons.

16 Claims, 22 Drawing Sheets

U.S. PATENT DOCUMENTS

| | | | | |
|---|---|---|---|---|
| 6,126,740 | A | * | 10/2000 | Schulz et al. .................. 117/4 |
| 6,306,506 | B1 | * | 10/2001 | Timmons et al. ............ 428/422 |
| 6,358,632 | B1 | * | 3/2002 | Dickey et al. .............. 428/690 |
| 6,399,689 | B1 | * | 6/2002 | Scarlette .................... 524/430 |
| 6,645,444 | B2 | * | 11/2003 | Goldstein ...................... 423/1 |
| 6,667,199 | B2 | * | 12/2003 | Torii et al. .................. 438/183 |
| 6,689,322 | B2 | * | 2/2004 | Mills et al. .................... 422/98 |
| 6,730,538 | B1 | * | 5/2004 | Meek et al. ................ 438/104 |
| 6,776,962 | B1 | * | 8/2004 | Boss et al. .............. 422/82.11 |
| 6,946,336 | B2 | * | 9/2005 | Pang et al. ................. 438/199 |
| 6,998,303 | B2 | * | 2/2006 | Sugita et al. ............... 438/199 |
| 7,019,391 | B2 | * | 3/2006 | Tran ........................... 257/678 |
| 7,037,595 | B1 | * | 5/2006 | Andre et al. ................ 428/632 |
| 7,049,347 | B2 | * | 5/2006 | Hu ................................ 516/78 |
| 7,112,833 | B2 | * | 9/2006 | Shimamoto et al. ........ 257/288 |
| 2003/0022422 | A1 | * | 1/2003 | Torii et al. .................. 438/183 |
| 2006/0165896 | A1 | * | 7/2006 | Afzali-Ardakani et al. . 427/258 |
| 2006/0260674 | A1 | * | 11/2006 | Tran ........................... 136/252 |

OTHER PUBLICATIONS

E. Delamarche, et al., "Golden Interfaces: The Surface of Self-Assembled Monolayers," Adv. Mater., 1996, pp. 719-729, vol. 8.

A. R. Bishop, et al., "Self-Assembled Monoilayers: Recent Developments and Applications," Curr Opinion Colloid Inter Sci, 1996, pp. 127-136, vol. 1.

M. R. De Guire, et al., "Synthesis of Oxide and Non-oxide Inorganic Mateirals at Orgaice Surfaces," Z. Metallkd, 1998, pp. 758-766, vol. 89.

M. Agarwal, et. al., Synthesis of $ZrO_2$ and $Y_2O_3$-Doped $ZrO_2$ Thin films Using Self-Assembled monolayers,: J. Am Ceram Soc, 1997, pp. 2967-2981, vol. 80.

H. Shin, et al., "Deposition Mechanism of Oxide Thin Films on Self-Assembled Organic Monolayers," Acta mater, 1998, pp. 801-815, vol. 46.

S. Baskaran, et al., "Titanium Oxide Thin Films on Organic Interfaces Through Biomimetic Processing," J. Am. Ceram. Soc., 1998, pp. 401-408, vol. 81.

Z. Xiao, et al., "The Deposition of $TiO_2$ Thin Films on Self-Assembled Monolayers Studied by X-Ray Photoelectron Sepectroscopy," Appl Surf Sci, 1998, pp. 85-92, vol. 125.

H. Lin, et al., "Preparation of $TiO_2$ Films of Self-Assembled Monolayers by Sol-Gel Method," Thin Solid Films, 1998, pp. 111-117, vol. 315.

S. Capone, et al., "Physical Characterization of Hafnium Oxide Thin Films and Their Application as Gas Sensing Devices," J Vac Sci Technol, 1998, pp. 3564-3568, vol. A16.

M. J. Esplandiu, et al., "Ellipsometric Investigation of Anodic Hafnium Oxide Films," Electrochim Acata, 1997, p. 315, vol. 42.

M. J. Esplandiu, et al., "Characterization of Hafnium Oxide Films Modified by Pt Doping," Electrochim Acta, 1995, p. 2587, vol. 40.

M. J. Esplandiu, et al., "Characterization of Hafnium Anodic Oxide Films—An AC-Impedance Investigation," Electrochim Acta, 1995, p. 809, vol. 40.

Y. Tsou, et al., "Optical Properties of Hafnia and Coevaporated Hafnia: Magnetism Fluoride Thin Films," Appl Opt, 1996, p. 5091, vol. 35.

R. Chow, et al., "Reactive Evaporation of Low-Defect Density Hafnia," Appl. Opt., 1993, p. 5567, vol. 32.

C. L. Platt, et al., "Spin-Dependent Tunneling in $HfO_2$ Tunnel Junctions," Appl Phys Lett, 1996, p. 2291, vol. 69.

G. Reisse, et al., "Deposition of Optical Coatings by Pulsed Laser Ablation," Appl Surf Sci, 1996, pp. 752-759, vol. 96, Issue 8.

F. Tcheliebou, et al., "Properties of $ZrO_2$ and $HfO_2$ Films Obtained by Reactive Thermal Evaporation," J De Phys IV, 1993, pp. 1003-1006, vol. 3.

K. Kukli, et al., "Tailoring the Dieletric Properties—$HfO_2$—$Ta_2O_5$ Nanolominates," Appl Phys Lett, 1996, p. 3737, vol. 68.

N. Balachander and C. N, Sukenik, "Monolayer Transformation by Nucleophilic Substitution: App . . . ," The ACS Journal of Langmuir, 1990, pp. 1621-1627, vol. 6, No. 11.

* cited by examiner

Fig. 8a       Fig. 8b

45 minutes 60 minutes 80 minutes 100 minutes

METHOD FOR FABRICATING HAFNIA FILMS

The United States government has rights in this invention pursuant to contract no. DE-AC05-00OR22725 between the United States Department of Energy and UT-Battelle, LLC.

FIELD OF THE INVENTION

The present invention relates to hafnia thin film fabrication, particularly to a method for fabricating hafnia film using a low-temperature route utilizing chemical-solution deposition of hafnia films on a solid substrate surface via self-assembled monolayers.

BACKGROUND OF THE INVENTION

Nature is replete with illustrations of the power of bio/organic interfaces to mediate nanostructure formation in organic, inorganic, and composite materials. Some common examples include bones, mollusk shell, teeth and avian eggshell. Such natural wonders have spurred leading scientists to pursue similar biomimetic routes for synthesis of advanced materials. Self-assembled molecular monolayers (SAMs) are beginning to be used as artificial versions of the "magical" natural interfaces, and are being investigated for synthesis of thin films for optical or sensing applications, nanocomposites for structural/thermal applications, and inorganic membranes for separations and catalysis.

Oxide ceramic layers or films on solid substrates have found significant applications in corrosion protection, chemical sensors, insulating films for capacitors, inorganic membranes for gas separations and catalysis, and in micro and optoelectronic devices. The useful applications of thin films are a result of specific material properties such as chemical and thermal stability, high refractive index, high damage threshold, or a high melting point. There is a great demand for oxide thin films that are structurally uniform, dense and adherent to solid substrates. The methods of oxide thin film fabrication include a variety of techniques, such as reactive e-beam processes, galvanostatic oxidation, dual ion beam sputtering, and atomic layer epitaxy. These methods typically require conditions of high temperature and vacuum. An alternative route for the synthesis of oxide thin films involves the use of aqueous chemical solutions and self-assembled monolayers (SAMs), a biomimetic or bio-inspired process.

The biomimetic processing is an area of increased interest in materials research due to the demand for new ceramic materials and more effective techniques for their production. This approach is inspired by immobilization that in general involves the formation of well-structured and complex-shaped organic/inorganic composites by the deposition of an inorganic solid on an organic matrix that consists of biomolecules like proteins. Biomineralization (i.e., the exquisite control over inorganic solid nucleation, crystallization and growth at organic interfaces in aqueous environments) usually occurs at ambient conditions with respect to temperature, pressure, and atmosphere. As a research tool, SAMs of organic molecules are utilized to mimic the contribution of organic surfaces/interfaces in the natural biomineralization processes. The chemical solution deposition of inorganic materials onto SAMs and amphiphilic structures has been suggested by others. The use of solution deposition on a solid substrate has several advantages over other film deposition techniques, including ambient conditions, possibility of one-step soft solution processing, more cost effectiveness, tailored chemical constituency, easiness to introduce impurities for phase stabilization, uniform film deposition on objects of complicated geometry or temperature-sensitive substrates, potential for patterned growth of films on solid substrates, and possible spontaneous formation of a highly complex, uniform large area structure.

Organic SAMs, such as those described by Agarwal et al., incorporated herein by reference, are highly ordered two-dimensional arrays of long-chain hydrocarbon molecules (X—$(CH_2)_n$—Y) of a specific length, which are covalently attached to a substrate through X-end functional group and possess a functional surface group Y that is projecting away from the substrate surface. The highly ordered and close-packed characteristics of the monolayer are a result of the strong interactions that exist between the substrate and the monolayer in addition to the short-range van der Waals forces between the chains. The functional terminal group Y on the SAM surface can be chemically modified without disturbing the monolayer to provide a favorable surface functionality necessary to initiate and promote deposition of metal oxide film from the surrounding solutions/colloidal suspensions. In addition to the ability to provide a desired surface functionality, SAMs can withstand temperatures up to 100° C. and solutions that are strongly acidic or basic. Readily prepared on a large scale, SAMs are mechanically and solvolytically stable. With these characteristics, SAMs can be used in a variety of conditions for the deposition of various oxides from aqueous or some non-aqueous solutions. SAMs can be patterned to selectively deposit inorganic films on desirable regions of substrate surface via controlled location of nucleation and orientation. In addition, SAMs can form on nanoscale curved surfaces and thus mediate the uniform growth or deposition of an inorganic film on the surface of a nanoparticle One of the fundamental, but critical problems is to how to lay down the high-quality nanostructured inorganic film on the organic surfaces of SAMs that already forms on a substrate. By definition, nanostructured films can be thin films with thickness between 1 to 100 nanometers, nanocrystalline films, films that contain nanoclusters, nanoporous films, or patterned films with nanoscale feature sizes. Nanostructured films clearly have shown great impact upon many technologies and applications. DeGuire et al. (1994, 1996, 1998) have achieved success in growing zirconia, titania, zinc oxide, tin oxide, and iron oxide thin films on substrate (silicon) surfaces via SAM interfaces (Agarwal et. al., 1997; Shin et al., 1998). Several other research groups also showed that through SAM interfaces, titania film can be grown on substrates like glasses and polymers. No one has ever attempted or mentioned the possibility of hafnia deposition by the SAM-mediated approach.

Previous research has demonstrated that thin films of various oxides (such as $ZrO_2$, $Y_2O_3$-Doped $ZrO_2$, ZnO, $SnO_2$, $TiO_2$, FeOOH, and $SiO_x$) and non-oxides (such as sulfides, silicon-dicarbodiimide, and GaN) can be deposited on self-assembled monolayers on solid substrates submerged in solutions. For example, wafers grafted with SAMs terminated with hydrophilic sulfonate groups ($SO_3^-$) were immersed into acidic aqueous solutions of zirconium sulfate, and a film layer of zirconia nanocrystals with amorphous admixtures of basic zirconium sulfate was deposited within several hours. The zirconia films were dense, adherent and could be converted into purely tetragonal phase by calcinations at 773K for 2 hours.

Oxide form of hafnia is a versatile material that shares a lot of desired thermal, mechanical, and chemical stability properties similar to those for zirconia ($ZrO_2$), such as high toughness, good refractory behavior, low thermal conductivity, and high oxygen ion conductivity at elevated temperatures. Corresponding to these unique properties, applications have been found in wear-resistant coatings, thermal barrier coatings, solid-oxide fuel cells, and oxygen sensors. In fact, $HfO_2$ is expected to be thermally tougher because it has a higher transition temperature (monoclinic to tetragonal structure at 1700° C.) and a lower expansion coefficient than $ZrO_2$. $HfO_2$ has a superb thermodynamic and chemical stability and a high melting point. Furthermore, $HfO_2$ has unique electrical properties as well as very high refractive index and excellent UV transparency (similar to titania) that could allow its use in optical coatings or electric/optical thin-film based devices, such as optical nanowaveguide/interconnects for future-generation nanoelectronic circuits.

There is a popular demand for a method that allows preparation of high-quality thin films, which are structurally uniform on a large scale, dense and adherent to the substrate. The methods that have been reported so far for hafnia thin film fabrication include: dual ion beam sputtering (Capone et al., 1998), electrochemical techniques (potentiodynamic, galvanostatic, and potentiometric conditions) (Esplandiu et al., 1997; 1995a; 1995b), reactive and conventional electron beam evaporation (Tsou and Ho, 1996; Chow et al., 1993), reactive sputtering (Platt et al., 1996), pulsed laser ablation (Reisse et al., 1996); reactive thermal evaporation (Tcheliebou et al., 1993), and atomic layer epitaxy (Kukli et al., 1996). Unfortunately, hafnia film fabrication technique via a cost-effective low-temperature route (i.e. SAM-mediated solution deposition) has not been yet been reported.

OBJECTS OF THE INVENTION

Accordingly, it is an object of the present invention to provide a low temperature method for fabricating high-quality hafnia film.

It is another object of the present invention to provide a feasible method for fabricating high-quality hafnia films that are structurally uniform.

It is yet another object of the present invention to provide a feasible method for fabricating high-quality hafnia films on solid substrates via self-assembled monolayers.

These and other objects, features and advantages of the present invention will become apparent after a review of the following detailed description of the disclosed embodiments and the appended claims.

SUMMARY OF THE INVENTION

In accordance with one aspect of the present invention, the foregoing and other objects are achieved by a method for fabricating hafnia film comprising the steps providing a substrate having a surface that allows formation of a self-assembled monolayer thereon via covalent bonding; providing an aqueous solution that provides homogeneous hafnium ionic complexes and hafnium nanoclusters wherein the aqueous solution is capable of undergoing homogeneous precipitation under controlled conditions for a desired period of time at a controlled temperature and controlled solution acidity for desired nanocluster nucleation and growth kinetics, desired nanocluster size, desired growth rate of film thickness and desired film surface characteristics. The method further comprises forming the self-assembled monolayer on the surface of the substrate wherein the self-assembled monolayer comprises a plurality of hydrocarbon chains cross-linked together along the surface of the substrate. The hydrocarbon chains are uniformly spaced from one another and each of the chains have a functional anchoring group at a first end of the hydrocarbon chain covalently bonded with the surface of the substrate and each of the hydrocarbon chains have a functional terminating group projected away from the surface of the substrate. The functional terminating group provides a bonding site for the hafnium film to grow. The method further exposes the substrate to the aqueous solution for a desired period of time at a controlled temperature wherein the hafnium ionic complexes and the hafnium nanoclusters are deposited on the bonding site of the functional terminating group of the self-assembled monolayer under controlled conditions for a desired period of time thereby forming the hafnia film wherein the hafnium bonded to the hydrocarbons and to one another provide a uniform ordered arrangement defined by the uniform arrangement of the hydrocarbons.

BRIEF DESCRIPTION OF THE DRAWINGS

In the drawings:

FIG. 8a shows temperature effects on solid particle formation in bulk solutions under conditions of 4 mM $Hf(SO_4)_2$, 0.1 N HCl.

FIG. 8b shows temperature effects on solid particle formation in bulk solutions under conditions of 10 mM $Hf(SO_4)_2$, 0.1 N HCl.

For a better understanding of the present invention, together with other and further objects, advantages and capabilities thereof, reference is made to the following disclosure and appended claims in connection with the above-described drawings.

DETAILED DESCRIPTION OF THE INVENTION

Applicant's invention is a method for the uniform deposition of hafnia precursor film on a solid substrate surface such as silicon, silicon wafers, glasses, polymers, ceramics or any other material that carries functional surface groups (such as —OH), via self-assembled monolayers (SAMs). Hafnium sulfate was used to prepare aqueous solutions, although nitrate or chloride salt or any other salt capable of undergoing particle nucleation and growth when in aqueous solution can also be used. The film deposition method of Applicant's invention comprises synthesis of SAM precursor molecules, SAM formation on solvent-cleaned wafers, and submerging SAM-coated silicon wafer in a solution in which process parameters such as inorganic salt concentration, acidity, temperature and incubation time are controlled. The process parameters affect the film thickness, surface roughness, and the nanocluster size on the film. As with zirconia systems, bulk (visible) precipitation, a prerequisite for the formation of hafnia films thicker than a few nanometers, occurs in the liquid phase during the film deposition. Homogeneous nucleation and nanocluster adherence to the oxide film surface is a dominant mechanism for hafnia film growth, although the heterogeneous nucleation and growth mechanism seems to be responsible for the formation of the first layer of hafnia on the SAM surface. Microwave volumetric heating was found to be useful for preparing uniform thin films in a very short time (a few seconds). Multiple batch deposition and continuous-nanocluster-forming (flow-through) processes seem to have the potential to decrease film surface roughness and to enhance the film growth efficiency. Hafnia thin films are used in sensors, optical interconnect circuits (as nanowaveguides), electronic devices, catalysis, and separation membranes.

Figure 1:
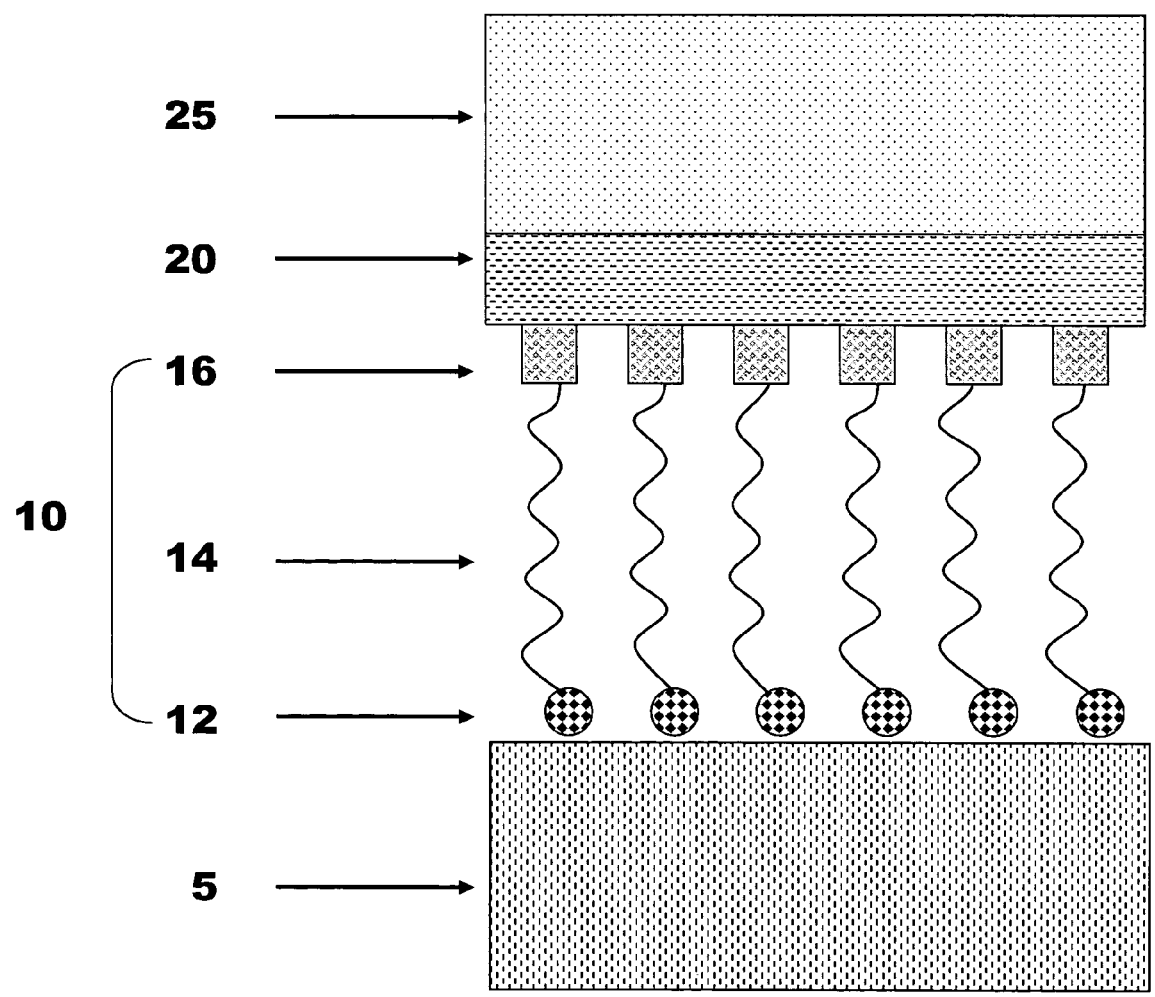
FIG. 1 is a schematic for inorganic film deposition on SAM-coated substrate.
Figure 2A:
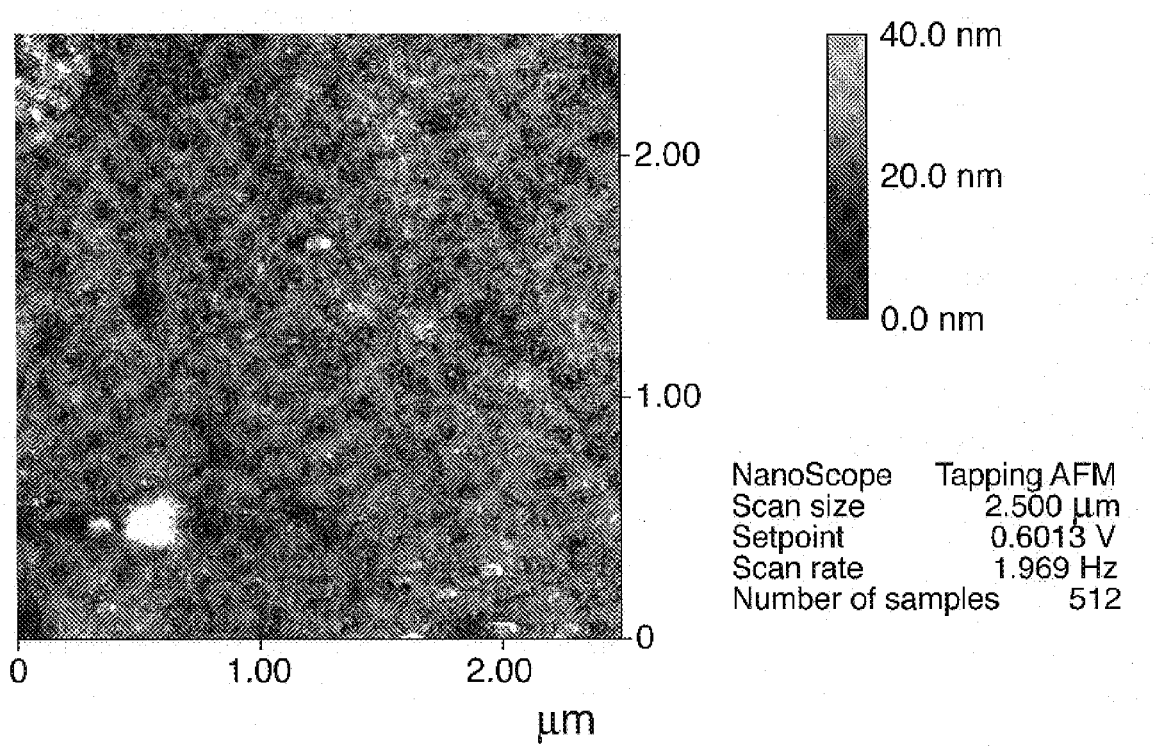
FIG. 2a is an AFM image of a hafnia film grown/deposited on SAM on silicon wafer under baseline conditions (4 mM $Hf(SO_4)_2$, 0.2 N HCl, 80° C., 6 hr 50 min.), 2.5×2.5: m scan area, showing the top view.
Figure 2B:
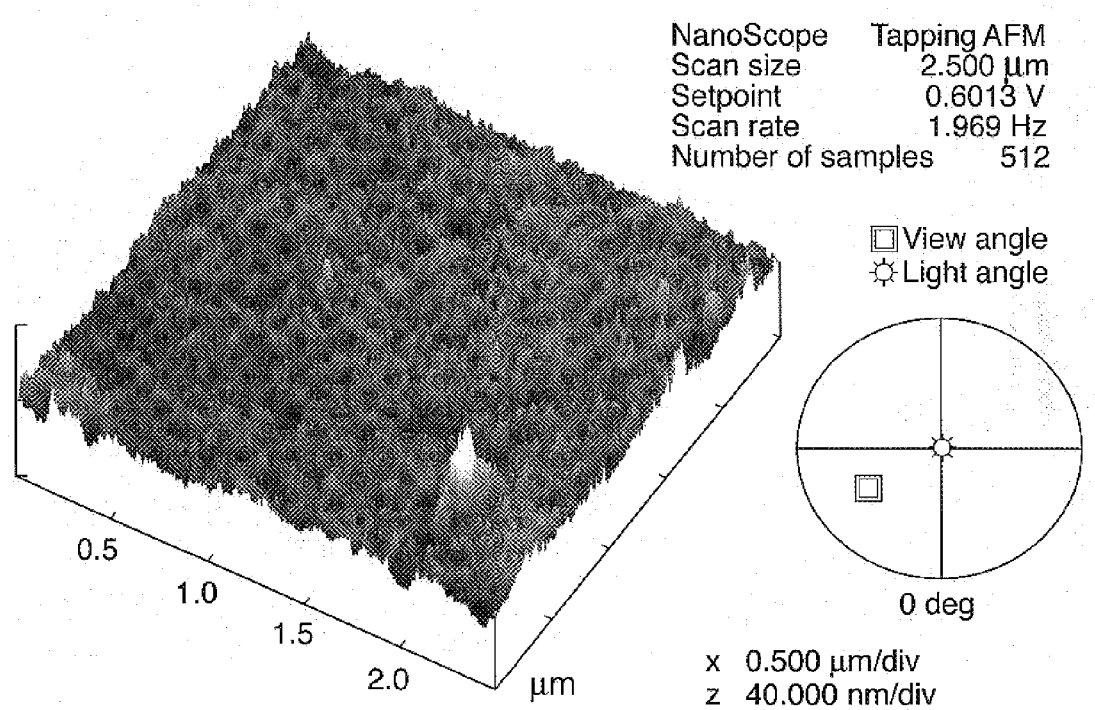
FIG. 2b is an AFM image of the hafnia film under same conditions as in FIG. 2a, 2.5×2.5: m scan area, showing a 3-D view.
Figure 2C:
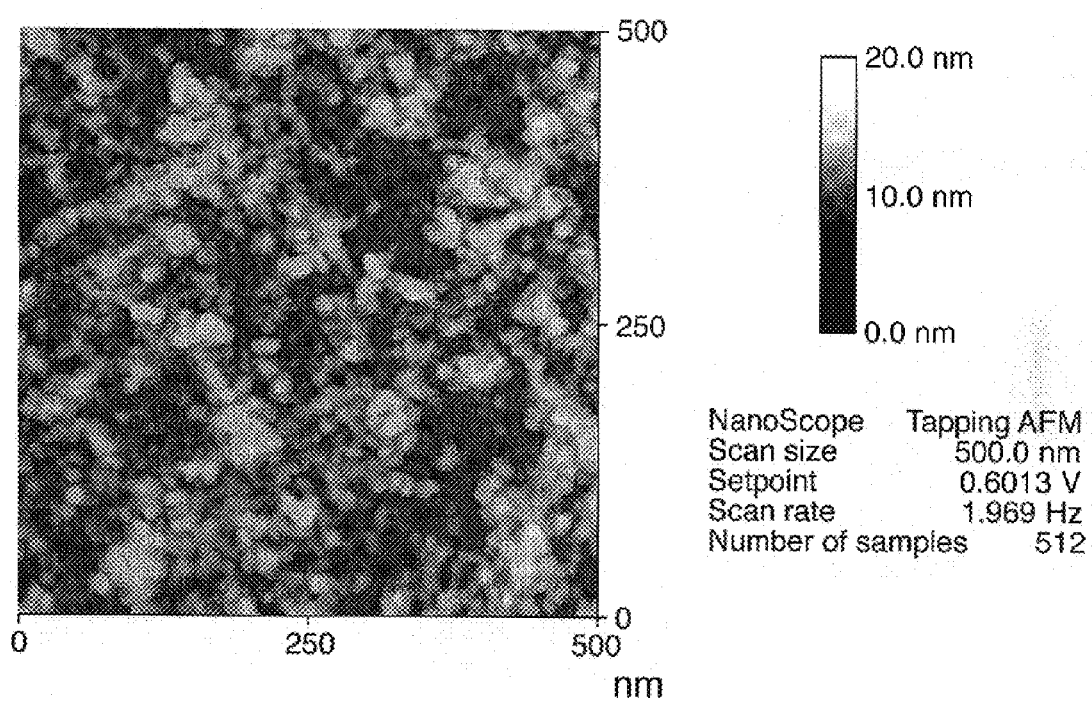
FIG. 2c is an AFM image of the hafnia film under same conditions as in FIG. 2a, 500×500 nm scan area, showing the top view.
Figure 2D:
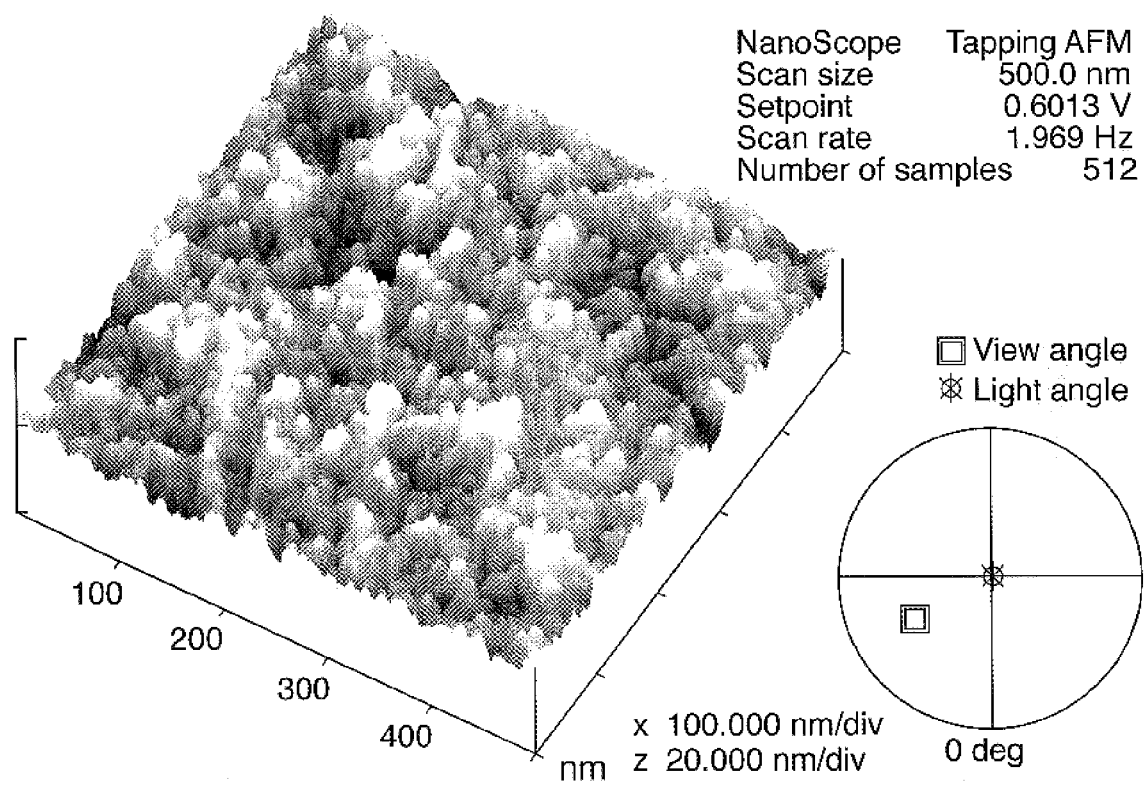
FIG. 2d is an AFM image of the hafnia film under same conditions as in FIG. 2a, 500×500 nm scan area, showing a 3-D view.

The basic elements in the film deposition method of Applicant's present invention include a solution (mostly aqueous) that provides homogeneous (hafnia) ionic nanospecies and/or solid nanoclusters under appropriate induction conditions (usually by heating), and a SAM-coated substrate. This is illustrated in FIG. 1 as FIG. 1 is a schematic showing the inorganic film deposition on SAM-coated substrate wherein the substrate 5 comprises any solid materials on which SAM can form, such as silicon, silicon oxide, glass, plastic, metals and other ceramics. Metal substrates include Ge, Al, Si, Ni and Ti or alloys thereof wherein the surface of said substrate includes an oxide. Metal substrates can further include platinum or gold. Semiconductors can also be used as substrates. The SAM precursor molecule is not limited to 1-thioacetate-16-(trichlorosilyl) hexadecane. Other SAM molecules such as thio-anchoring (instead of trichlorosilyl-anchoring group) molecules will form SAM on metal (gold) surfaces. FIG. 1 shows the SAM layer 10 comprising a bonding or anchoring group 12 (e.g., $SiCl_3$), a spacer 14 (—$CH_2$—)$_n$ and a surface or terminal group 16 (e.g. —$SO_3H$). The inorganic ($HfO_2$) film layer 20 is a mirror-like film and 25 is the aqueous chemical solution which provides homogeneous hafnia ionic nanospecies and/or solid nanoclusters under appropriate induction conditions.

The trichlorosilyl groups of SAM precursor molecules anchor covalently on the OH-containing surface of a substrate through siloxane bonds. The highly ordered, closely packed molecular arrays in a SAM are maintained due to the van der Walls forces (attractive) and electrostatic forces (repulsive) between the long hydrocarbon chain molecules. The thickness of the SAM layer (—$(CH_2)_{16}^-$) is around 25 Å. The distance between two terminal (thioacetate) groups is 4.3 Å. The SAM is stable under even harsh deposition conditions (<~100° C., pH<~10). The chemical conversion of surface terminal group from thioacetate to sulfonate can be done in situ. The deprotonation of the desired sulfonate terminal group ($-SO_3H \rightarrow -SO_3^- + H^+$) could occur even in strong acid solutions, thus provide high, uniform, negative charge density on the SAM surface. The sulfonate terminal groups ($-SO_3^-$) are active sites on which inorganic nanoclusters nucleate or deposit. Depending on the substrate material, covalent coupling of hydrocarbon chain of SAM to the solid substrate surface is not limited to an $-OH$ (hydroxyl) group via siloxane bonds. Such covalent coupling could also be through groups like $-NH_2$ or substrate $(Au)-S-(CH_2)_n-$, etc. Depending on the substrate surface chemistry, there exists a flexibility to tailor the bonding functional group in the hydrocarbon chain molecules.

The film deposition method comprises solution preparation, substrate surface cleaning by solvents, SAM formation on a solvent-cleaned substrate surface, and submerging the SAM-coated substrate in the solution in which process parameters (temperature, concentration of inorganic salt precursor, acidity, and heating/incubation time) were controlled. The detailed seven steps are described as follows:

1) Solution preparation. The purpose of the solution is to provide inorganic ionic species and/or nanoclusters (i.e., hafnium ionic complexes or hafnium compounds) that can deposit onto the substrate surface and become intrinsic part of the inorganic film. The solutions needs to satisfy certain criteria such as (i) the solution starts as clear dissolved salt solution, (ii) the solution undergoes a homogeneous precipitation under controlled conditions such as raising temperature for a certain period of time. Generally, process parameters such as concentration salt, solution temperature, solution acidity, and heating/incubation time, need to be controlled for desired nanocluster nucleation and growth kinetics, nanocluster size, growth rate of film thickness, and film surface characteristics. Specifically, hafnium salt such as $Hf(SO_4)_2$ was used as one example of Applicant's invention. All inorganic salts were used as received. The hafnium sulfate solutions were prepared from hafnium sulfate (99.9+%, purity exclude 1–2% zirconium, Aldrich Chem. Co., WI). Deionized water was used for all preparation steps.

2) Substrate. The substrate can be any solid containing $-OH$ groups on the surface, such as silicon wafers (with an intrinsic oxide layer on the surface), glasses, plastics, and metals/alloys that contains a native oxide layer on the surface. In Applicant's specific example for demonstrating hafnia film growth, p-type single-crystal (100) silicon wafers were used, polished on one side or both sides. Wafers were typically cut into 1 cm by 1 cm or 2 cm by 2 cm squares.

3) Substrate Cleaning. Cleanness of the substrate surface is critical to the uniformity of the SAM and the inorganic film characteristics. The cleaning for silicon wafers involved (i) manual wiping using solvent-soaked low-lint tissues, with chloroform, acetone, and ethanol in sequence, (ii) immersion in ethanol, and iii) blow drying with clean, filtered (0.45 μm) argon until the wafer surface was completely mirror-like. Typically, the wafers were cleaned four times with solvents. During the cleaning process, the wafer was rotated ninety degrees after each surface wiping.

4) Surface Oxidation/Hydroxylation. This step created a thin 1.5–2.0 nm, uniform, hydrolyzed layer of amorphous $SiO_2$ on the silicon wafers. This involved: (i) the cleaned wafers were immediately immersed in a 10-ml "piranha" solution (i.e., 7 ml concentrated $H_2SO_4$ (95–97%) plus 3 ml chilled, aqueous 30% H stirred) contained in a capped glass vial, a Teflon container, or a Petri dish in an ice bath. (ii) The solution was then heated to an elevated temperature (typically 80° C.) on a heating plate and held for at least 30 minutes to one hour. It is important to make sure that the surface is fully wettable by deionized water. The wettibility was checked by a contact angle meter. (iii) Wafers were rinsed three times in deionized water and blow dried with clean, filtered argon.

5) Formation of Thioacetate-SAM on Silicon Wafer Surface. SAM precursor surfactant is 1-thioacetate-16-(trichlorosilyl)hexadecane, which was synthesized with Balachander and Sukenik's procedure (Langmuir, 6, 1621–1627 (1990), incorporated herein by reference) with slight modification, including (i) Grignard reaction: to produce ω-hexadecenylbromide: $H_2C=CH(CH_2)_9Br+Br(CH_2)_5Br \rightarrow H_2C=CH(CH_2)_{14}Br$. (ii) Exchange of bromine surface group for thioacetate: $H_2C=CH(CH_2)_{14}Br+KSCOCH_3 \rightarrow H_2C=CH(CH_2)_{14}SCOCH_3$ Separation of thioacetate via HPLC. (iv) Hydrosilylation (catalyzed by $H_2PtCl_6$) to attach the trichlorosilane bonding group: $H_2C=CH(CH_2)_{14}SCOCH_3+HSiCl_3 \rightarrow Cl_3Si(CH_2)_{16}SCOCH_3$. NMR was used to reactions to completion. (v) Kugelrohr distillation of the 1-thioaceto-16(trichlorosilyl)hexadecane surfactant. (vi) The surfactant was stored in a bottle wrapped with aluminum foil, sealed under argon, and kept in a desiccator for extended periods. For the formation of thioacetate-SAMs on solvent-cleaned silicon wafer surfaces, the following procedure was used: (i) several hydroxylated wafers (1 cm² square each) were immersed in a slowly stirred solution of surfactant (1.0 vol. % surfactant in 5 ml of dicyclohexyl solvent) at room temperature, under an inert atmosphere (typically argon in a glove box) for 5 hours. (ii) Each wafer was thoroughly cleaned twice manually with fresh chloroform-soaked tissues, until the surface was again perfectly mirror-like, then rinsed again with chloroform and blow dried with clean, filtered argon. (iii) The thioacetate-SAM-coated wafers were stored dry in a desiccator, wrapped in aluminum foils to prevent inadvertent photooxidation of SAM. (iv) Thickness of the thioacetate-SAMs was determined by ellipsometry, around 2.5 nm. Typical values of contact angle of water on hydrophobic thioacetate-SAM surfaces were 73°±3° (advancing) and 65°±3° (receding). These measurements were consistent with those reported by Agarwal et. al.

6) Oxidation of Thioacetate-SAMs to Sulfonate-SAMs (i.e., $-SCOCH_3 \rightarrow SO_3H$): The hydrophobic thioacetate terminal groups ($-SCOCH_3$) were converted to hydrophilic sulfonate terminal groups ($-SO_3H$) on the surface of the SAM layer. The anionic sulfonate groups ($-SO_3^-$) offered the desired sites for deposition or nucleation/growth of inorganic nanoclusters that later became an intrinsic part of the inorganic film. For terminal group oxidation, the following procedure was used: (i) dust particles were removed from the thioactate-SAM-coated wafer surface by blowing a stream of nitrogen or argon. (ii) A solution of "oxone" in deionized water was prepared. Plenty of oxone ($2KHSO_5.KHSO_4.K_2SO_4$, a monopersulfate oxidizing agent) were added to have the solution over-saturated i.e. salt on the bottom of the beaker, at room temperature. (iii) The thioactate-SAM-coated wafer was placed in the oxone solution in a beaker covered with parafilm to keep dust away. This is done in normal atmosphere. (iv) Oxidation needs a minimum of 4–5 hours (usually overnight) at room temperature. (v) The wafer was rinsed with deionized water and stored in the water until further use. The converted surface of a SAM-coated wafer should be fully wetted by deionized water; otherwise it needs to be oxidized longer. Typical contact angle of hydrophilic sulfonated surfaces is ~30°±2° (advancing) and <10° (receding). The $SO_3H$-SAM wafers should be used as soon as possible. It was noticed that the $SO_3H$ surface attracts dust particles easily and thus may cause surface contamination.

7. Inorganic ($HfO_2$) Thin Film Deposition on SAM-Coated Substrate. The SAM-coated wafer was submerged in a clear hafnium salt ($Hf(SO_4)_2$) solution, in which the salt concentration, acidity, temperature, and incubation time were controlled. The ranges of experimental conditions are: hafnium salt concentration (4 and 10 mM), pH (HCl acid concentration 0.1–0.6 N), temperature (70°, 80° and 90° C.), and time (0–250 minutes). Solutions were prepared by dissolving the appropriate mass of metal salt, depending on the desired concentration, in filtered deionized $H_2O$ and then adding the appropriate volume of acid. The sulfonate SAM-coated wafer was immersed in the hafnium salt solution in an Erlenmeyer flask, which was submerged in a constant-temperature water bath. In each experimental condition, a clean, hydrolyzed bare silicon wafer (with no anchored SAM) was also immersed under identical conditions as a control. After the desired deposition time, the wafer was removed, rinsed three times with filtered deionized water and sonicated for one minute between rinses. The wafer was then blow dried with filtered air and stored in Chemwipes for later analysis. One baseline condition for hafnia film deposition is: 4 mM $Hf(SO_4)_2$, 0.2 N HCl, 80° C. and 6 hours. Without SAM, no or poor inorganic films were observed on the bare silicon wafer surfaces. With the use of sulfonate-SAM interface, colorful mirror-like $HfO_2$ films (brown or blue color, depending on the film thickness) have been grown on the SAM surfaces.

The tools used to study the film and solution/colloids system include optical ellipsometry to conduct non-destructive, fast measurements of film thickness (film-growth kinetics) and refractive index (typically ranging from 1.3 to 1.8 for the hafnia film samples). Spectroscopic ellipsometry measurements were taken of the hafnia films using the two-modulator generalize ellipsometer (2-MGE) and analyzed using a simple 3-medium model consisting of air/hafnia film/crystalline silicon. Atomic force microscopy (AFM) was also used to examine the film surface (roughness) and to determine the nanocluster size and morphology on the surface. Transmission electron microscope (TEM) was used to examine the cross-section of films and show the film thickness and internal film microstructure. Small-angle x-ray scattering (SAXS) was further used to observe early-stage evolution (nucleation and growth) of small nanoclusters in solutions. In-situ dynamic laser light scattering (DLS) was used to monitor the solid particle formation and growth in the bulk solutions during heated incubation. The general concept of the DLS setup involved the scattering of laser light by the sample particles in a thermally controlled quartz cell. A low-power He—Ne laser was used as the incident beam source, and a photomultiplier tube is placed at a 90° angle to the incident beam in order to observe the scattering. The scattered light from the particles, which contains information on the Brownian motion of the particles, is used by a BI9000-AT (DOS version 6.6) digital correlator (Brookhavent Instruments Corp., Holtsville, N.Y.) through the application of the Stokes-Einstein equation to infer the average size (hydrodynamic diameter) of the particles. The instrument is capable of measuring particles typically in the range of 5 nm to 1 μm accurately. To study the particle growth, salt solutions were contained in a capped, quartz cuvette cell that was placed in the DLS cell holder that is heated at a constant temperature. The particle formation and growth were monitored by collecting autocorrelation curve data at various incubation times. The effects of several parameters such as temperature, concentration of the inorganic salt, and acidity on the characteristics of the particles were studied. Scanning electron microscope (SEM) was used to examine the size and morphology of precipitated particles from bulk solutions. Thick suspensions of particles were spread on a carbon conductive tape attached to the surface of a SEM brass stub. After the particles had dried, they were coated with palladium-gold by plasma sputtering (Hammer 6.2 Sputtering System, Anatech Ltd.) for approximately two minutes in preparation for SEM imaging.

In the experimental conditions tested for Applicant's invention, a bulk solution precipitation was needed to initiate the film deposition on the surface of the SAM-coated substrate. Initial experiments were conducted to search for synthesis conditions that allowed reasonable induction period, during which there is no formation of DLS-visible precipitate particles (i.e. greater than a few nanometers) in bulk solutions of acidified hafnium sulfate. Changing parameters such as amount of hydrochloric acid added in the solution, hafnium salt concentration, and temperature can tune the hydrolysis/condensation kinetics and thus the induction period for precipitation of solid hafnia particles in bulk solutions. This induction period was determined by a dynamic light scattering technique. A baseline synthesis condition of 4 mM $Hf(SO_4)_2$, 0.2 N HCl and 80° C. was first established to give an induction period of approximately 40 minutes.

"Control" tests confirmed that uniform hafnia films could not be obtained by solution deposition onto SAM-free, bare silicon wafer surfaces. In contrast, optical quality, mirror-like colorful hafnia films have been grown/deposited onto the SAM-coated silicon surfaces. By visual observation of the films, hafnia grew from a gold yellow/brown into a blue color with extended time. AFM images of the films obtained under the typical baseline conditions are shown in FIG. 2a, FIG. 2b, FIG. 2c and FIG. 2d. This is the very first hafnia film that has ever been prepared by the approach of solution deposition on a SAM. The film consists of nanoparticles or nanoclusters in the order of magnitude of 10 nanometers, which does not seem to correlate to the large colloidal particle size (submicrons to microns) observed in the bulk precipitated solution. From the 3D view of FIG. 2d, it was estimated that the film surface roughness is less than ±1 nm. The low roughness explains the mirror-like surface of the film. It is typical to see a few "large" colloids adsorbed on the film surface (for example, the bright spot in FIG. 2a). The surface attached particles are much larger than the constitutive nanoparticles in the film, usually loose and can be cleaned off by ultrasonication.

Figure 3A:
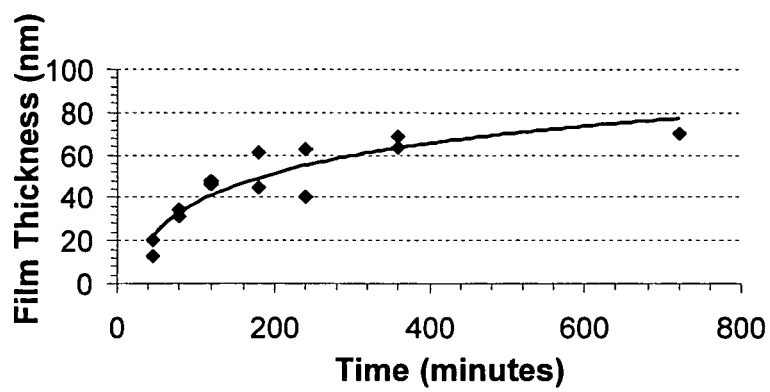
FIG. 3a shows a film growth kinetic curve under conditions of 4 mM $Hf(SO_4)_2$, 0.2 N HCl, 80° C., showing a film growth rate of 0.4 nm/min.
Figure 3B:
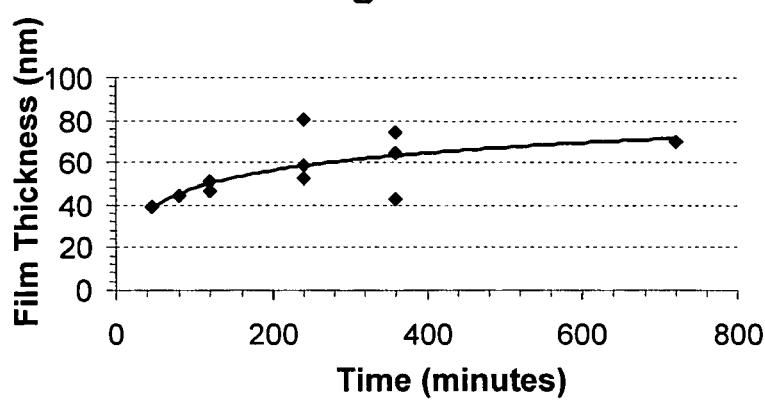
FIG. 3b shows a film growth kinetic curve under conditions of 4 mM $Hf(SO_4)_2$, 0.2 N HCl, 90° C., showing a film growth rate of 0.7 nm/min.
Figure 3C:
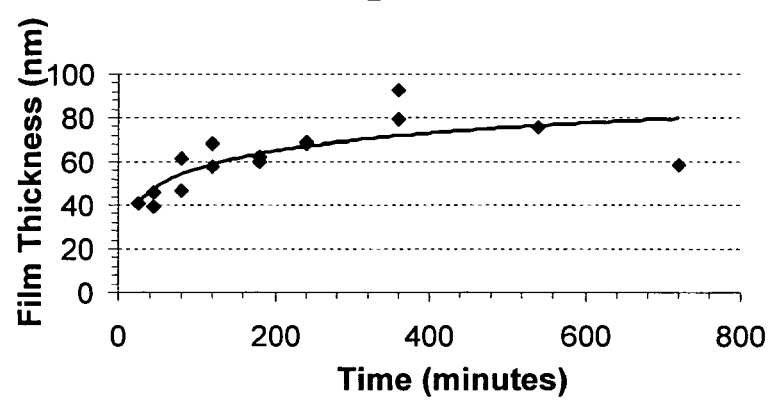
FIG. 3c shows a film growth kinetic curve under conditions of 10 mM $Hf(SO_4)_2$, 0.2 N HCl, 80° C., showing a film growth rate of 1.3 nm/min.
Figure 3D:
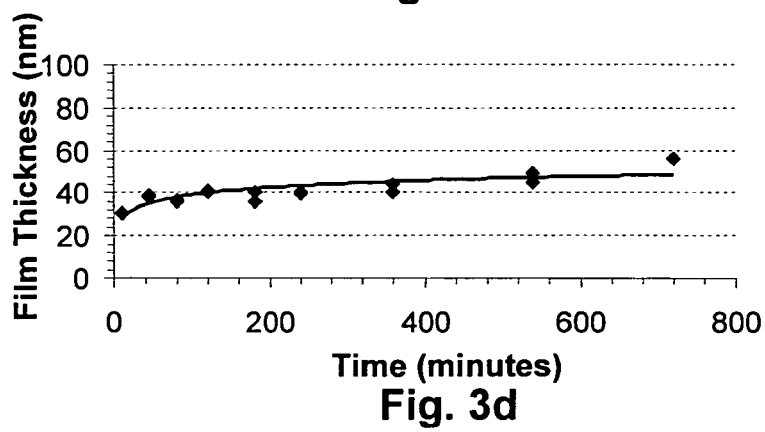
FIG. 3d shows a film growth kinetic curve under conditions of 4 mM $Hf(SO_4)_2$, 0.1 N HCl, 80° C., showing a film growth rate of 2.0 nm/min.

A series of single-batch deposition tests were conducted. Sulfonate SAM-coated silicon wafers (with surface of interest facing up) were immersed in solutions of hafnium sulfate at the bottom of the capped flasks. Several major process parameters including temperature, concentration of hafnium salt, concentration of HCl acid, and film growth time were studied for their effects on hafnia film thickness growth kinetics, shown in FIG. 3a, FIG. 3b, FIG. 3c and FIG. 3d. Film thickness data was collected by an ellipsometry technique. Comparison of the film growth curve of FIG. 3a and FIG. 3b shows that with increasing temperature, the film growth rate is increased, particularly in the beginning of the film growth stage (right after the induction period). By comparing FIG. 3a with FIG. 3c, it can be seen that higher concentration of inorganic salt also results in a higher film growth rate in the initial growth stage. Regardless of the concentration and temperature changes, final thicknesses approach around 80 nanometers. Comparison between FIG. 3a and FIG. 3d indicates that lower HCl acid concentration corresponds to a faster initial film growth rate, however, the final film thickness is thinner. This may be explained by the higher nucleation and nanoparticle formation rate in solutions of lower acidity. More fractions of nanoparticles are consumed for the solid formation in the bulk solution, leaving less fractions of nanoparticles toward film growth. In all cases shown in FIG. 3a, FIG. 3b, FIG. 3c and FIG. 3d, film growth with time is a nonlinear curve and slows down at longer times, which seems to be due to the gradual depletion of small hafnium ion complexes and/or nanoclusters in the bulk solution phase. In other words, film growth rate is the largest in the early stages immediately after the induction period and this rate decreased with time in the later stage. It was also observed that faster film growth corresponded to faster bulk solution precipitation. Therefore, Applicant tested a microwave rapid heating process and preliminary studies show that microwave heating is very effective for rapid deposition of thin film on a SAM-coated silicon wafer. The film formation occurred on the substrate surface in just a few seconds of microwave heating.

Figure 4:
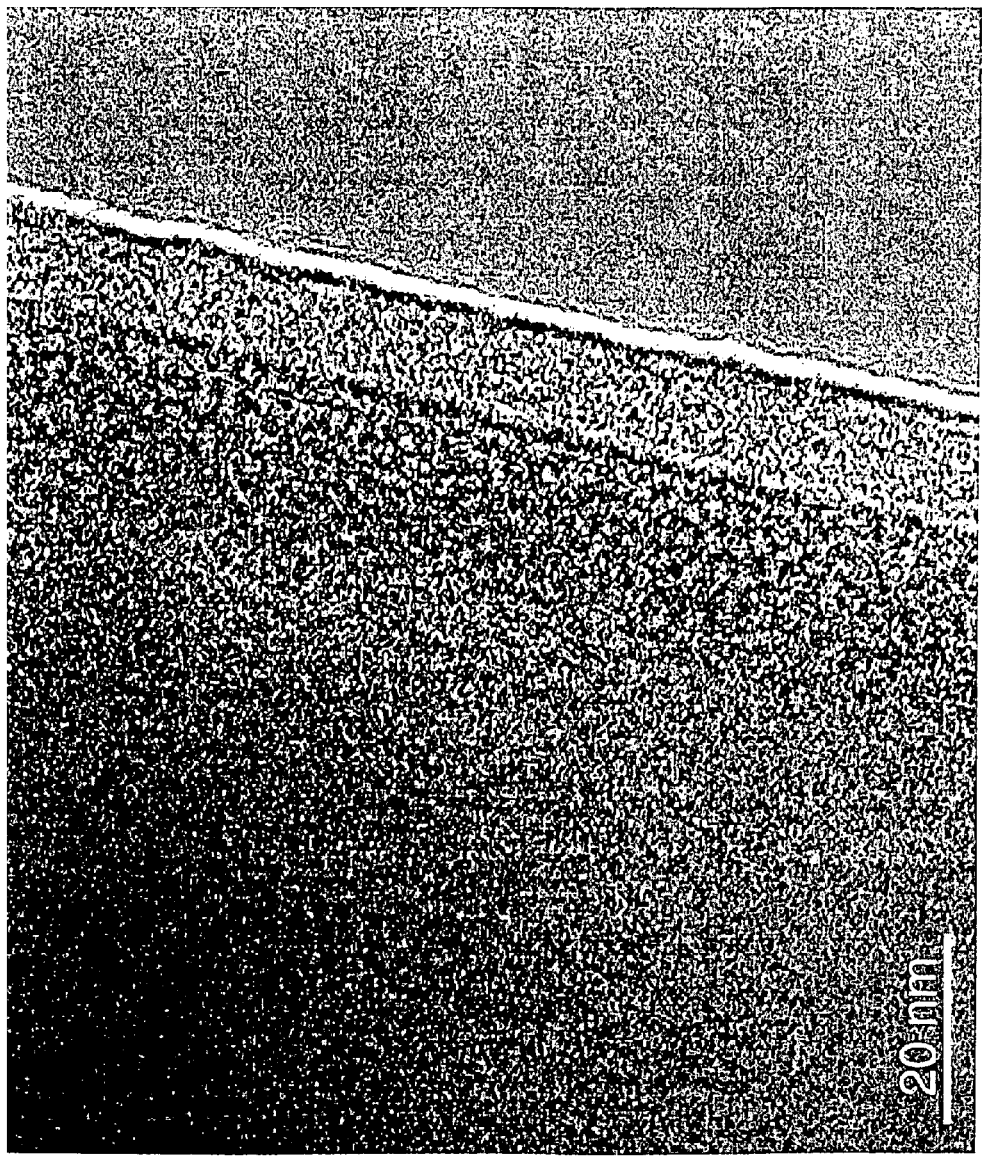
FIG. 4 is a high-resolution TEM image of hafnia film (cross-section), showing nanoparticle-assembling nature of the film layer.

TEM image of a uniform film cross-section is shown in FIG. 4 and the film thickness determined by the TEM (~15 nm) was agreeable with the ellipsometry measurement. The microstructure of the film consists of homogeneously distributed nanoparticles and crystallinity of the film cannot be observed. It is noted that other parameters such as the ratio of the solution volume over the silicon wafer surface area also affects the film thickness. Thus, this volume-to-area ratio was maintained constant through Applicant's studies.

Figure 5A:
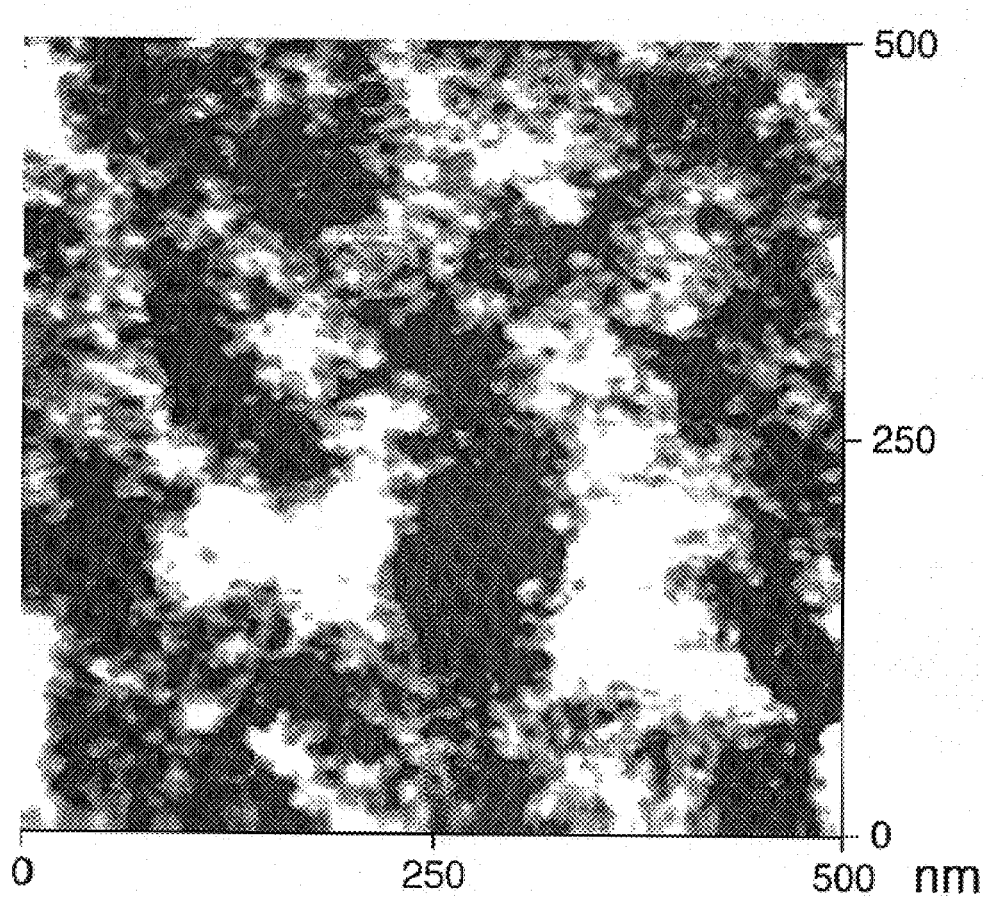
FIG. 5a is an AFM surface characteristic image of hafnia film obtained under conditions of 4 mM $Hf(SO_4)_2$, 0.2 N HCl, 80° C., 4 hr.
Figure 5B:
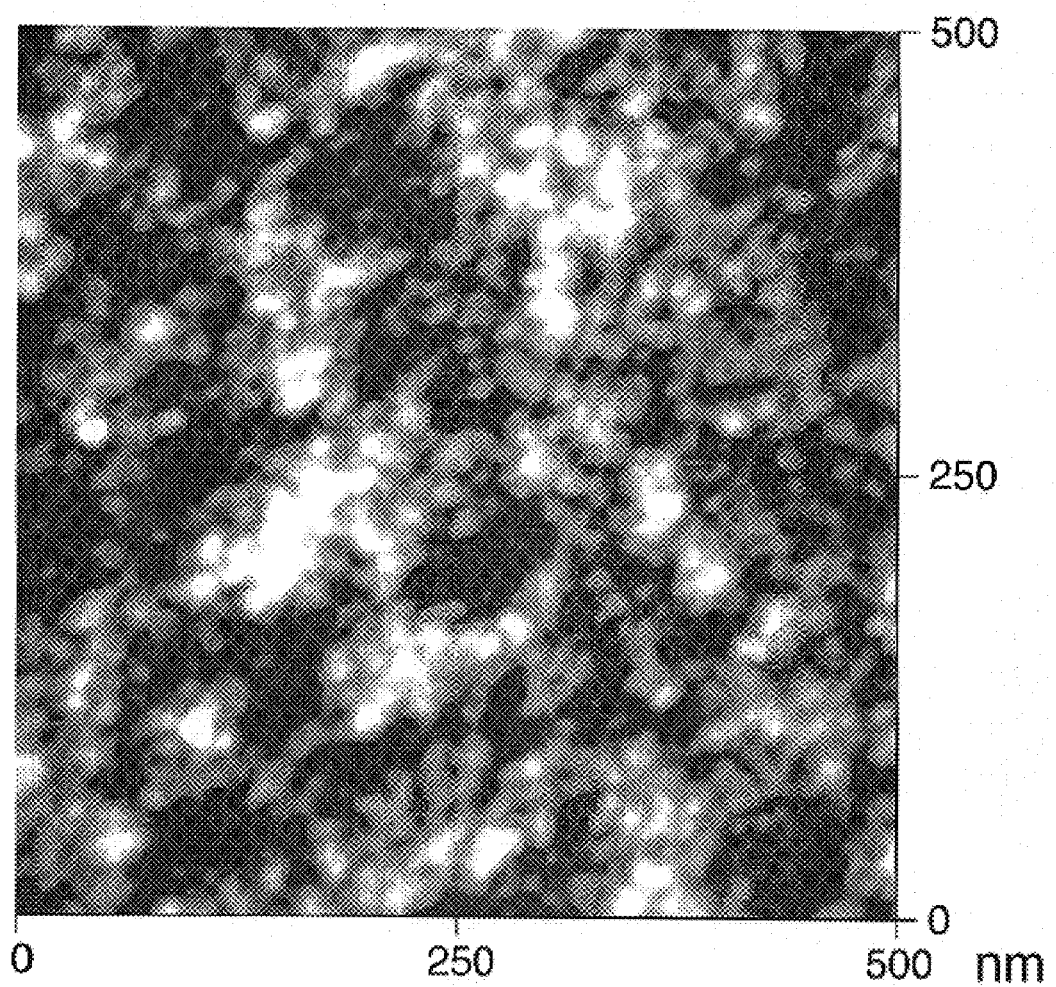
FIG. 5b is an AFM surface characteristic image of hafnia film obtained under conditions of 4 mM $Hf(SO_4)_2$, 0.2 N HCl, 90° C., 4 hr.
Figure 5C:
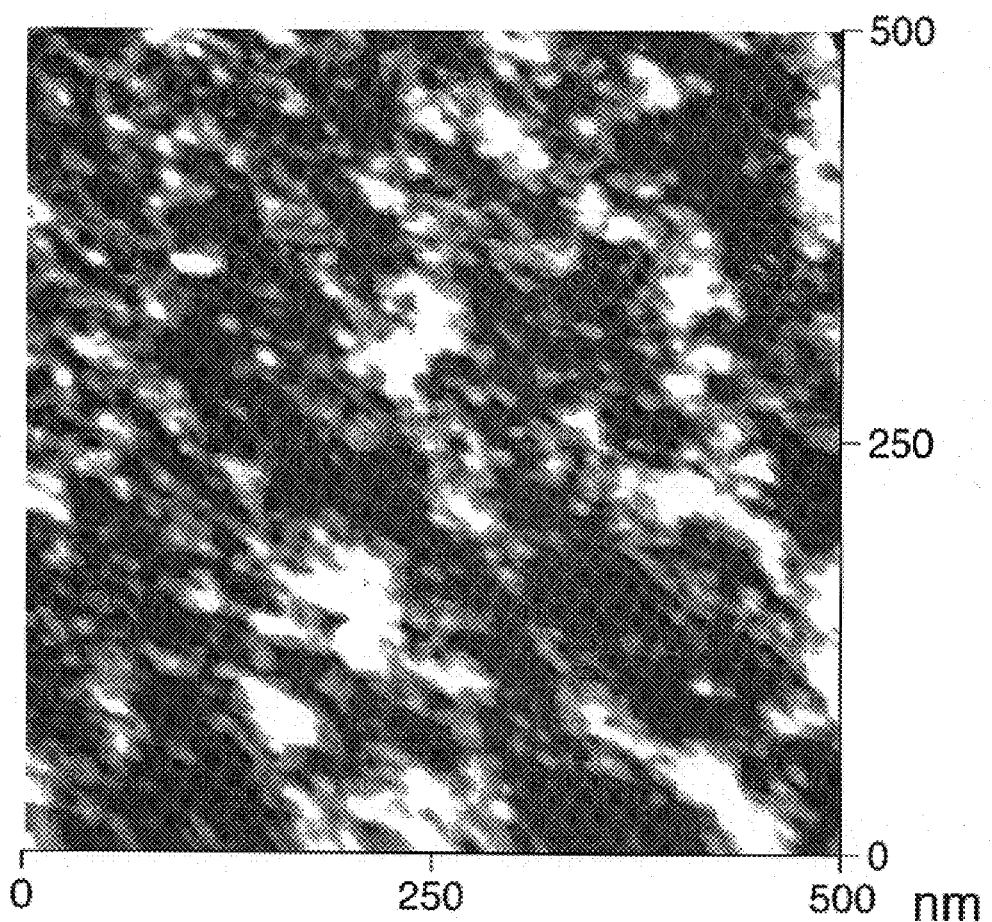
FIG. 5c is an AFM surface characteristic image of hafnia film obtained under conditions of 10 mM $Hf(SO_4)_2$, 0.2 N HCl, 80° C., 4 hr.
Figure 5D:
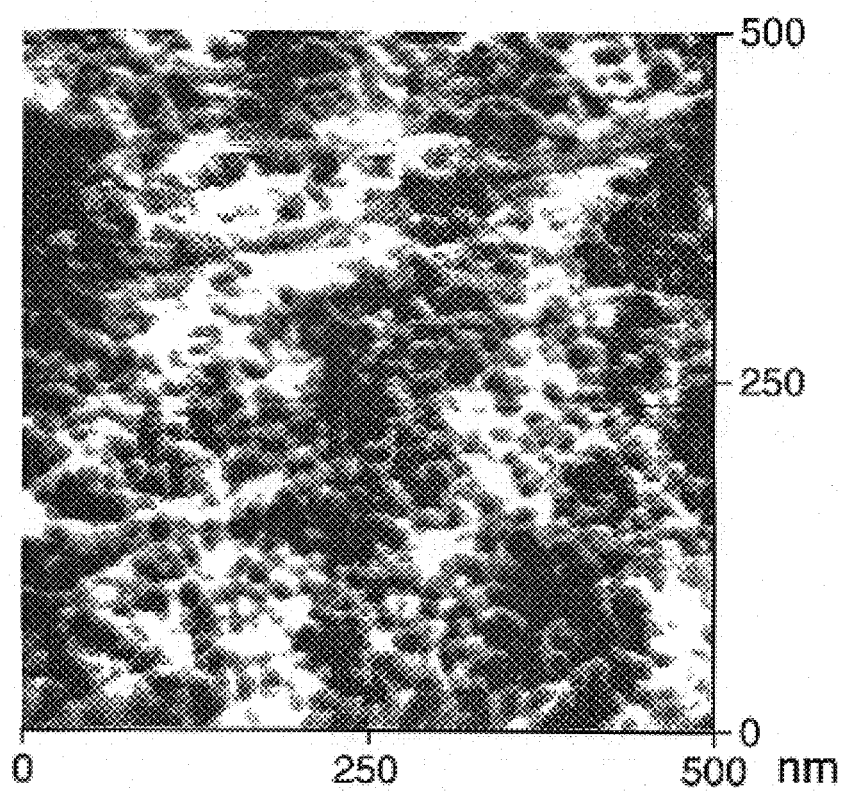
FIG. 5d is an AFM surface characteristic image of hafnia film obtained under conditions of 4 mM $Hf(SO_4)_2$, 0.1 N HCl, 80° C., 4 hr.

Effects of the process conditions on surface characteristics of hafnia films were examined by AFM. As compared with FIG. 2c, the surface of a film obtained at a shorter immersion time appears rougher, see FIG. 5a. Higher temperature (90° C. versus 80° C.) and higher hafnium salt concentration (10 versus 4 mM Hf) seem to result in rougher film surfaces (FIGS. 5b and 5c) consisting of larger particles, due to higher precipitation, coagulation and deposition rate that tend to lead to loose aggregate structures. At lower acidity (0.1 versus 0.2 N HCl), the obtained film seems more densely packed with a smoother surface, however, the constitutive primary particles in the film are larger (FIG. 5d).

Figure 6A:
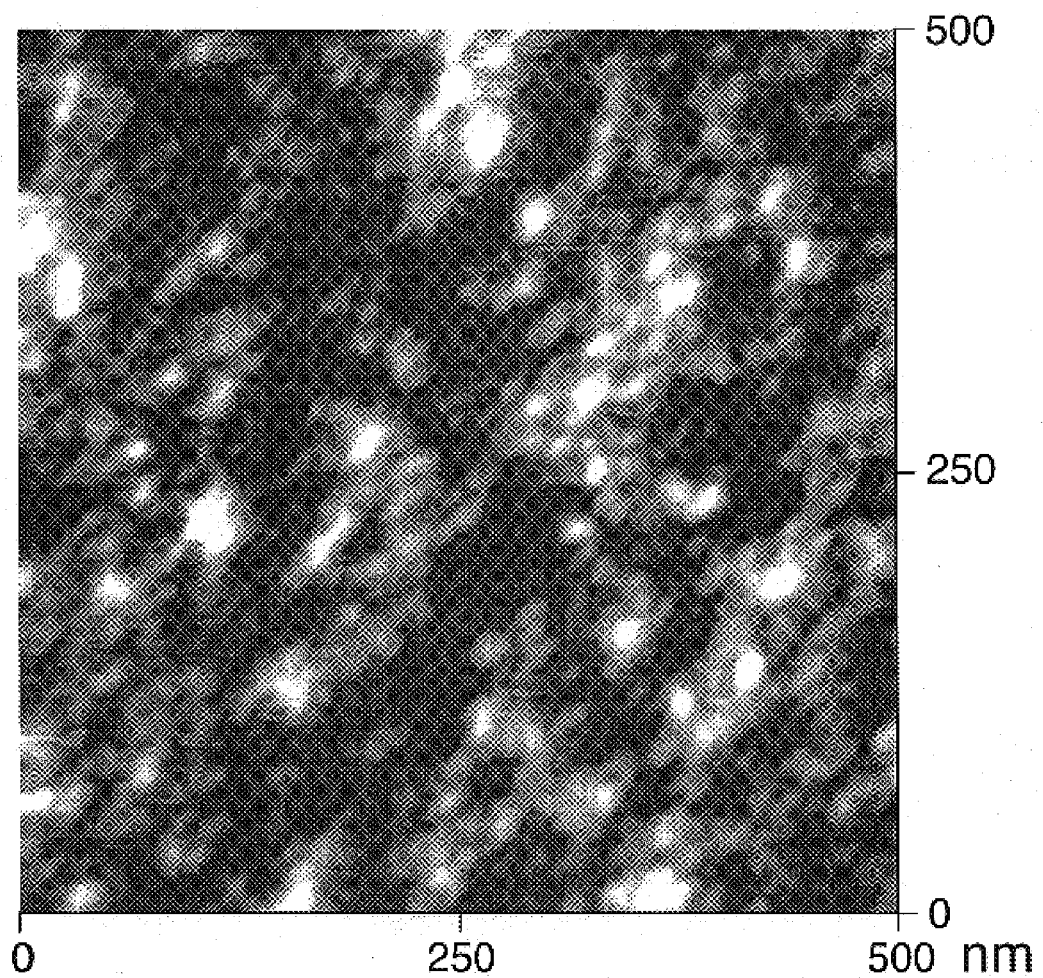
FIG. 6a is an AFM surface characterization of hafnia film by one batch growth/deposition using a solution of 4 mM $Hf(SO_4)_2$, 0.2 N HCl, 90° C., 4 hr total immersion time; produced 52.97 nm thickness.
Figure 6B:
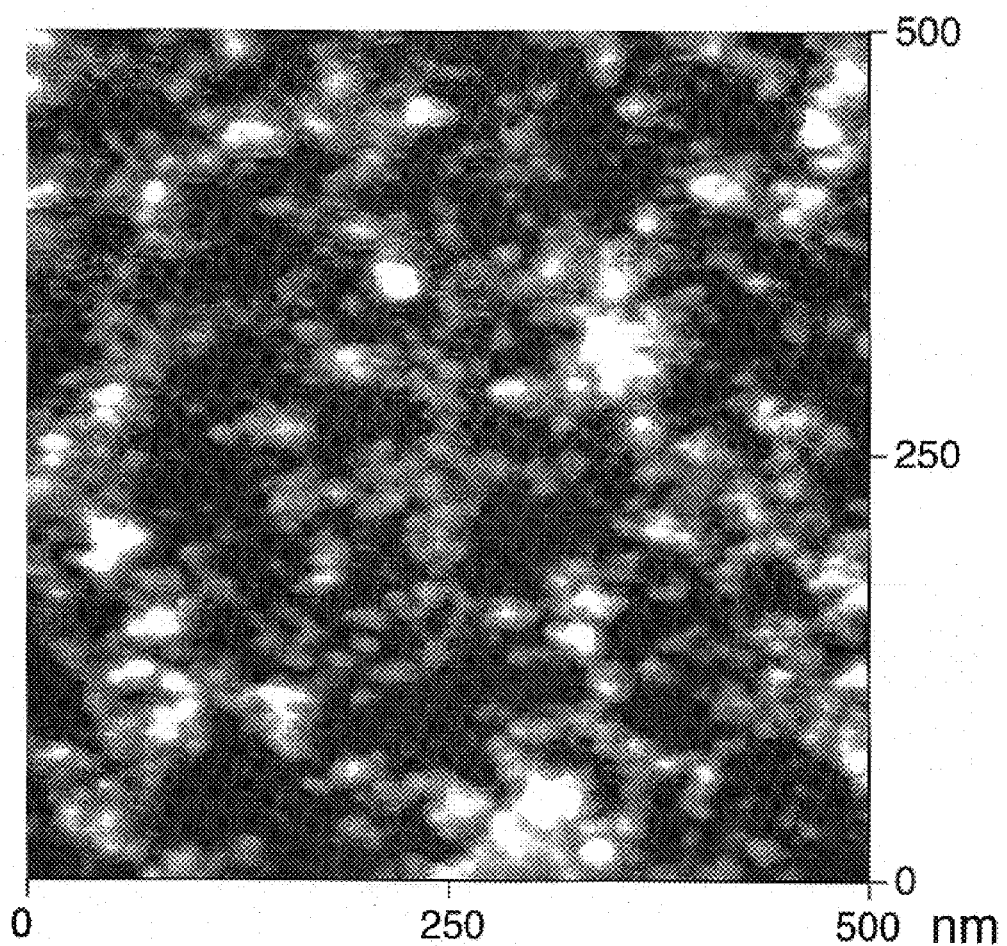
FIG. 6b is an AFM surface characterization of hafnia film by two batches growth/deposition of 2 hr immersions, using a solution of 4 mM $Hf(SO_4)_2$, 0.2 N HCl, 90° C., 4 hr total immersion time; produced 75.71 nm thickness.
Figure 6C:
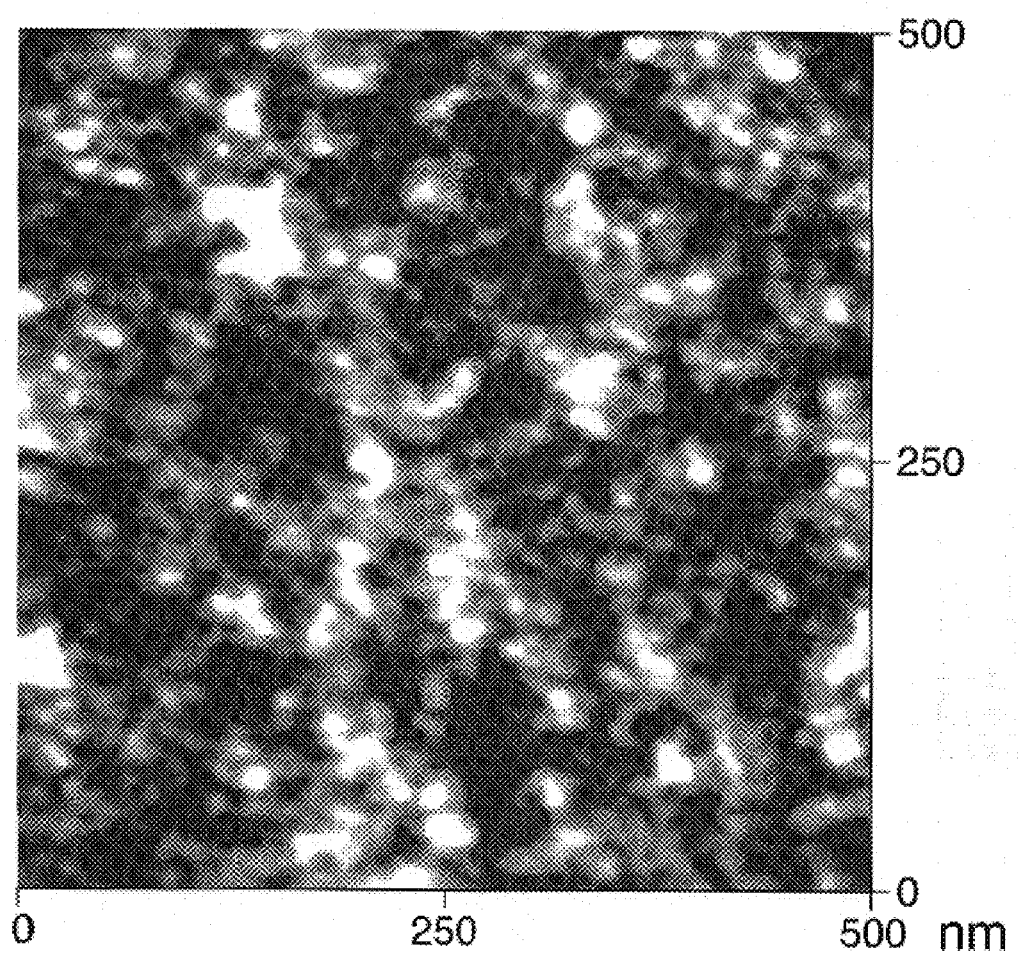
FIG. 6c is an AFM surface characterization of hafnia film by four batches growth/deposition of 1 hr immersions, using a solution of 4 mM $Hf(SO_4)_2$, 0.2 N HCl, 90° C., 4 hr total immersion time; produced 82.99 nm thickness.

The root-mean-square (RMS) of the film surface Z-distance fluctuation per AFM were used as a parameter for roughness analysis. The values of the RMS (thickness) are measured as 1.805 (53.0 nm), 1.738 (75.7 nm) and 1.693 (83.0 nm), respectively, corresponding to the film obtained by one batch of 4-hr deposition, two batches of 2-hr depositions, and four batches of 1-hr depositions. (As a control, the RMS for a solvent cleaned SAM surface is approximately 0.365 mm). In these three film samples, the total immersion time was four hours, and fresh solutions were used in each batch. In a batch deposition, film growth rate (as well as the hydrolysis/condensation kinetics) is a function of time, generally high in the beginning and then decreasing with time in the later stage. Comparisons of film samples by multiple shorter batch deposition experiments with those by single-batch longer depositions were examined by AFM (FIG. 6a, FIG. 6b and FIG. 6c), indicating a general trend that multiple depositions produced films with smoother surfaces. Based on this observation, it is believed that so-called "continuous nanocluster supply" method may minimize the surface roughness and increase the film growth rate. In this method, a stable (i.e. same size and age) source of nanoclusters in suspension/sol is continuously flowing over the substrate surface. This avoids formation of large, overgrown particles (like those produced in the later stage of single-batch bulk precipitation). Thus, during flow-through deposition, the surface of a SAM or a later grown film always exposes to the consistent source of uniform, nano-sized hafnium clusters/species of the same age, allowing pseudo-steady state deposition.

To clarify the film formation mechanism (i.e., heterogeneous surface nucleation and growth vs. solid nanoparticle nuclei adsorption/adherence), two experiments were designed and conducted. In the first experiment, SAM-coated wafers were immersed to premade suspensions of nanoparticles (approximately 10 nm and 40 nm, respectively) that were adjusted to the level of 0.2 N HCl, 80° C., for 6 hours. Note that this is the identical condition to what is normally used for film growth from initially clear solutions. After removal from the solution, the wafers were rinsed and sonicated for one minute, and blown dry. It appeared that there were no films formed on the wafer surfaces. This observation supports that colloidal interaction between preexisting nanoparticles (of 10 nm or greater) and the SAM surfaces is weak under the condition tested, and thus, particle-surface interaction not responsible for the original film deposition. In the second experiment, SAM-coated silicon wafers were immersed in the precursor solution (4 mM Hf(SO$_4$)$_2$, 0.2 N HCl, 90° C., 4 hr total time) in four different ways: 1) immersed in the starting fresh clear solution, (2) immersed 10 minutes after the solution turn turbid, (3) immersed 30 minutes after the solution turn turbid, and (4) immersed 2 hours after the solution turn turbid. Film thicknesses measured by ellipsometry were 70.73, 38.43, 39.89, and 40.45 nm, respectively. This result indicates that interaction between in-situ grown nanoparticles and film surface is important and the film thickness gain is mostly contributed by nanoparticle adsorption after the induction period. Film thickness increase is also significant around the turbidity point of the bulk solution. Based on the above two experimental observations, it is believed that heterogeneous nucleation and in-situ growth of nanoparticles on active surface sites (e.g., —SO$_3^-$) are responsible for the formation of the very initial layer of hafnia film on the SAM surface. In fact, the coincidence of initial film formation with the appearance of nanoparticle nucleation at the induction period supports such film formation mechanism. It should be noted that film growth mechanism may be different from the film formation mechanism. Once the SAM surface was covered with the initial hafnia layer, strong coagulative adherence or adsorption of hafnia nanoparticles/nanoclusters from the bulk solution onto the existing hafnia film surface will take effect as dominant mechanism for the further growth of film thickness. (This strong interaction between hafnia particles and surfaces, casing rapid colloid growth and colloidal instability in the bulk solutions, is further confirmed by later dynamic light scattering studies of hafnia particle growth and aggregation. Hafnia nanoparticles tend to coagulate tightly to each other due to the condition of colloidal instability.)

It was further observed that in the beginning of bulk precipitation (i.e., immediately after the induction period), there is nearly no film formation on the SAM-coated substrate surface. Film thickness increase occurred only after the bulk precipitation and it is a kinetically controlled process. This finding indicates that the early-stage film did not grow rapidly probably due to the slow, continuous nucleation of nanoclusters. Film growth depends on the continuous formation of nanoclusters with time, while particle growth and aggregation in bulk solutions occur and also consume some nanoclusters. Otherwise, a rapid film deposition immediately after the induction period would be expected.

The experimental observations discussed above support that the film formation always co-exists or correlates synergistically with the heat-induced hydrolytic precipitation of solid nanoparticles in bulk solutions. The nanoparticle nucleation, growth and aggregation phenomena in the bulk solution are closely related to the film formation. Therefore, SAXS, DLS and SEM are tools that have been used to understand the solid nucleation and particle growth in bulk solutions under the conditions used for film deposition. The process parameters include salt concentration, acidity (in terms of HCl concentration), temperature, and immersion/incubation time.

Figure 7A:
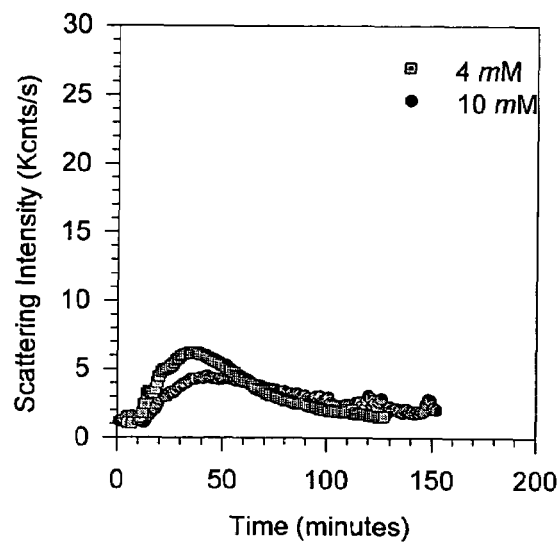
FIG. 7a is a particle solid growth curve monitored by DLS showing the concentration effect of $Hf(SO_4)_2$ on particle formation in bulk solutions under conditions of 70° C., 0.1 N HCl.
Figure 7B:
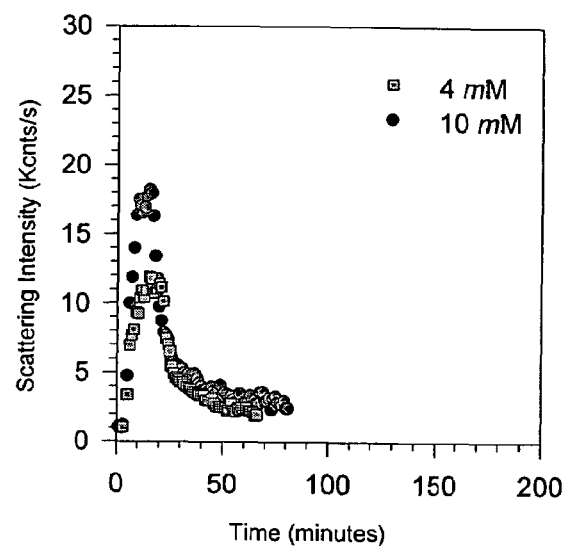
FIG. 7b is a particle solid growth curve monitored by DLS showing the concentration effect of $Hf(SO_4)_2$ on particle formation in bulk solutions under conditions of 80° C., 0.1 N HCl.
Figure 7C:
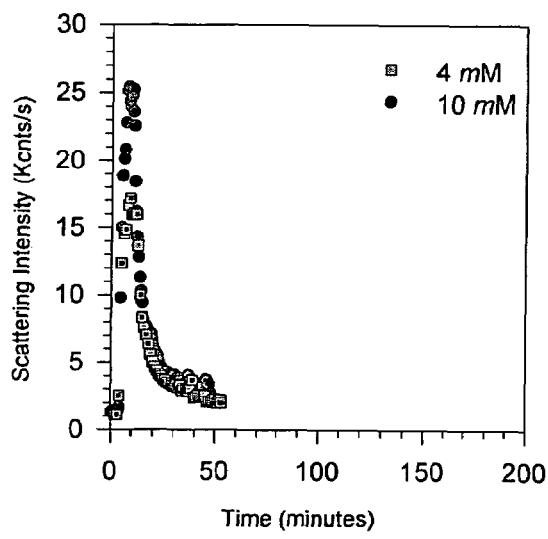
FIG. 7c is a particle solid growth curve monitored by DLS showing the concentration effect of $Hf(SO_4)_2$ on particle formation in bulk solutions under conditions of 90° C., 0.1 N HCl.
Figure 7D:
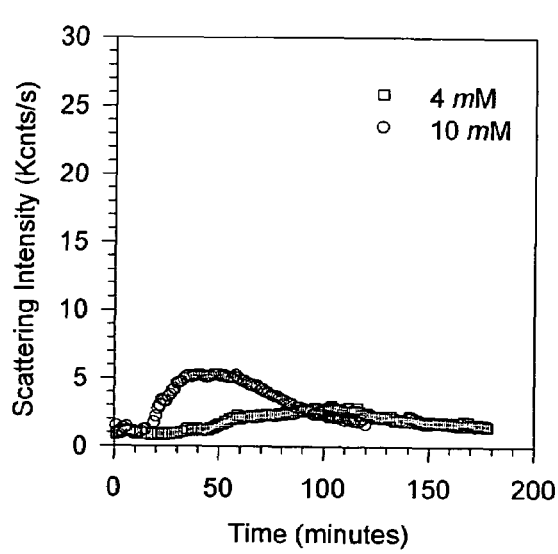
FIG. 7d is a particle solid growth curve monitored by DLS showing the concentration effect of $Hf(SO_4)_2$ on particle formation in bulk solutions under conditions of 80° C., 0.2 N HCl.

SAXS results for zirconia film formation show that higher HCl concentration inhibits the nanocluster growth rate in the early stages (before 100 minutes of incubation). A higher salt concentration gives a slightly higher nanocluster growth rate. A typical particle solid growth curve monitored by DLS for the precipitation in an unstirred cuvette cell (as shown in FIG. 7d) has three stages: (1) induction period, during which a primary particle (of a few nanometers in size) formed by hydrolysis and condensation reactions; during this period the DLS can not detect the appearance of particles when particles are smaller than ~5 nm in size and scattering intensity is less than ~1 kilocounts per second, (2) particle growth stage, during which there are increases of particle size, mass, and scattering intensity with time, (3) observed decreases in scattering intensity with time due to sedimentation of large aggregated or agglomerated particles (so the DLS can only "see" residual suspended small particles). It was noticed that changes of averaged effective hydrodynamic diameters of particles in bulk solutions with time follows the same trend as the changes of scattering intensities with time. Significant concentration effects on the induction period of solid particle formation (i.e., 45 and 15 minutes corresponding to 4 and 10 mM hafnium, respectively) were found under 0.2 N HCl and 80° C. film growth conditions (FIG. 7d). In general, with increasing salt concentration, the induction period decreased and the particle growth rate increased. However, such concentration effects are no always true. Under other conditions (such as 0.1 N HCl), the particle growth rate was decreased as the concentration of hafnium sulfate increased from 4 to 10 mM (FIG. 7a). This effect is due to acidic inhibition of the hydrolysis reaction, because the solution of higher salt concentration is expected to be more acidic due to higher sulfate concentration. From FIG. 7a, FIG. 7b and FIG. 7c, it can be seen that higher temperature causes a faster rate of scattering intensity increase with time, indicating a faster formation rate of solid particles. Higher acidity (0.2 N HCl in relative to 0.1 N HCl, comparing FIG. 7d with FIG. 7b gives a longer induction period and slower scattering intensity increasing rate with time, indicating effect of acid (HCl) inhibition to the hydrolysis/condensation and thus solid nucleation rate.

Figure 8C:
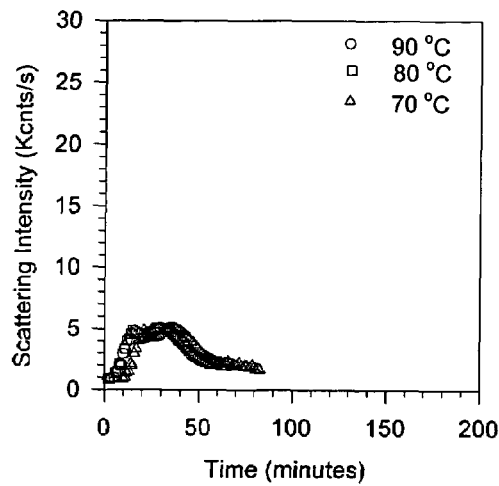
FIG. 8c shows temperature effects on solid particle formation in bulk solutions under conditions of 4 mM $Hf(SO_4)_2$, 0.2 N HCl.
Figure 9A:
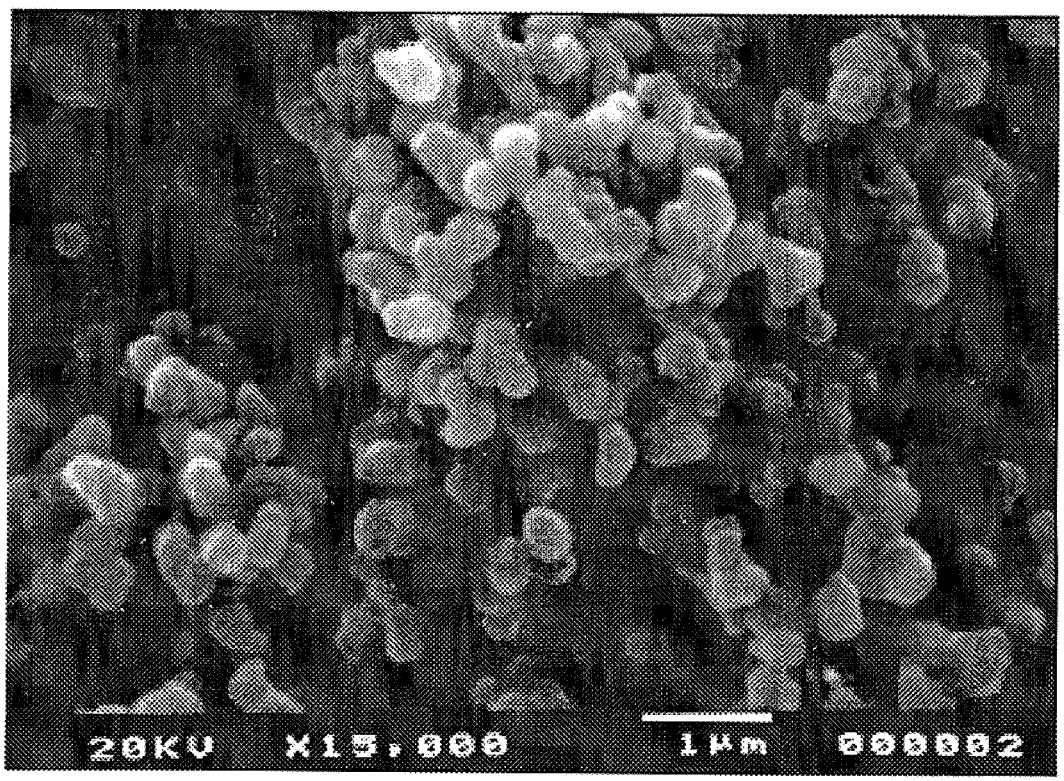
FIG. 9a is an SEM image of solid particles obtained from bulk solutions at different temperatures under conditions of 4 mM $Hf(SO_4)_2$, 0.2 N HCl, incubation time of 215 min., 80° C.
Figure 9B:
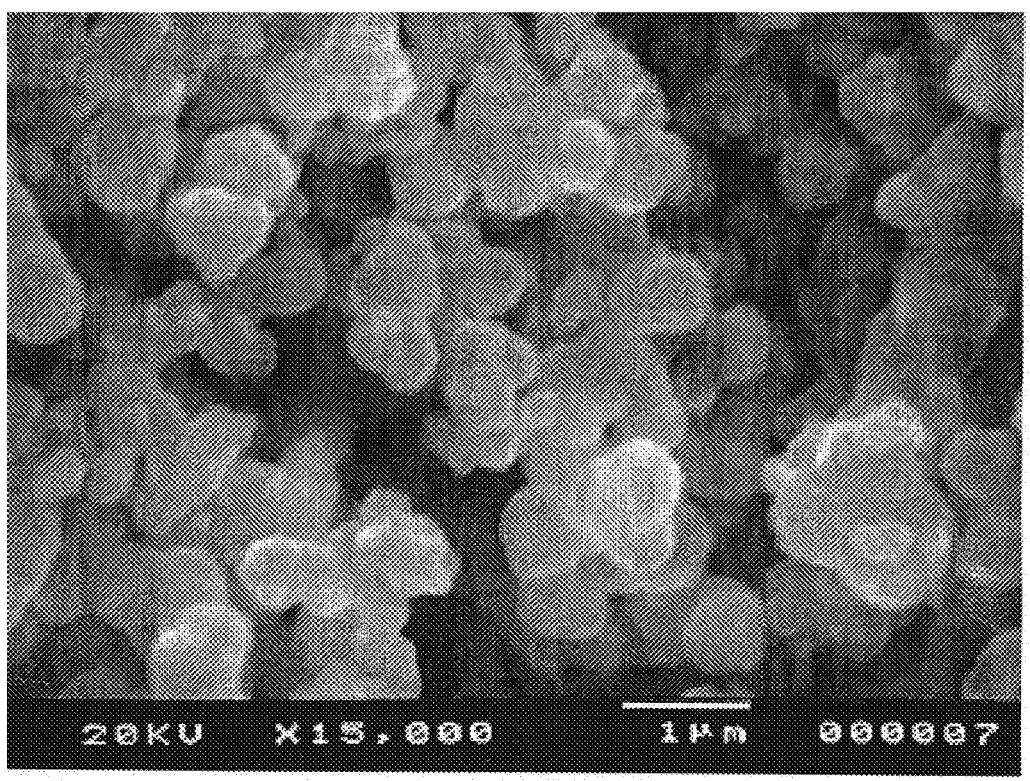
FIG. 9b is an SEM image of solid particles obtained from bulk solutions at different temperatures under conditions of 4 mM $Hf(SO_4)_2$, 0.2 N HCl, incubation time of 215 min., 90° C.
Figure 10A:
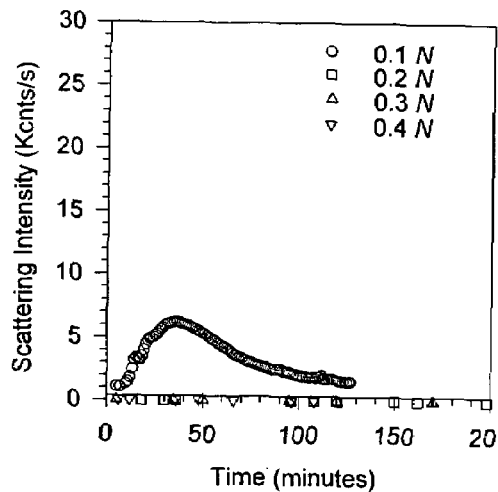
FIG. 10a shows the effect of acidity (HCl) on solid particle formation in bulk solutions under conditions of 4 mM $Hf(SO_4)_2$, 70° C.
Figure 10B:
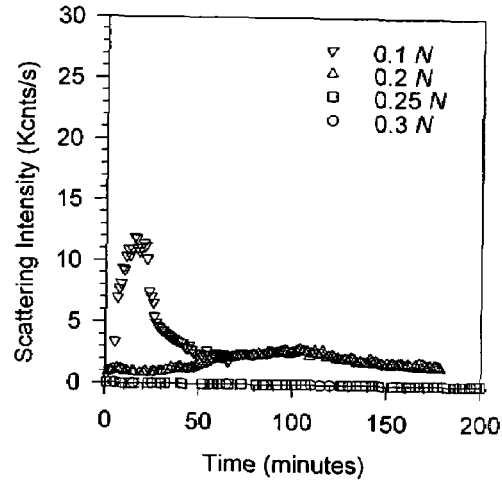
FIG. 10b shows the effect of acidity (HCl) on solid particle formation in bulk solutions under conditions of 4 mM $Hf(SO_4)_2$, 80° C.
Figure 10C:
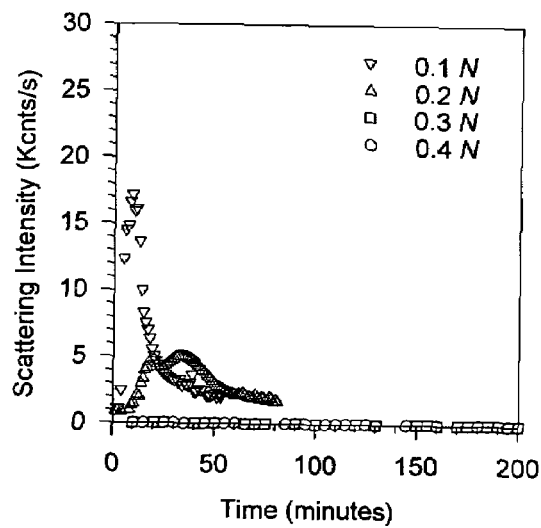
FIG. 10c shows the effect of acidity (HCl) on solid particle formation in bulk solutions under conditions of 4 mM $Hf(SO_4)_2$, 90° C.

Further temperature effects are shown in FIG. 8a, FIG. 8b, and FIG. 8c. As the temperature increases, the induction period decreases, and the final particle size and growth rate increase. This temperature effect on size is also supported by SEM results as shown in FIG. 9a and FIG. 9b. At a certain incubation time, the particles obtained at 90° C. are larger in size than those obtained at 80° C. The solids from bulk solutions are aggregates and agglomerates of submicrometer, near-round particles that may be assembled from primary nanoparticles. The effect of acidity (in terms of HCl concentration) on the particle growth is systematically illustrated in FIG. 10a, FIG. 10b, and FIG. 10c. As the acidity of the solution increases, the hydrolysis reaction and thus the solid particle nucleation/growth are decreased and solid particle formation could be totally inhibited in conditions of high acidity (>0.2 N HCl). Data for induction periods and initial rate of particle solid growth are summarized in Table 1.

TABLE 1

Induction periods, initial particle growth rate, and estimated initial film growth rate under various conditions*

| HCl Conc. | 4 mM Hf(SO$_4$)$_2$ | | | 10 mM Hf(SO$_4$)$_2$ | | |
|---|---|---|---|---|---|---|
| | 70° C. | 80° C. | 90° C. | 70° C. | 80° C. | 90° C. |
| 0.1 N | 11 (21) | 3 (50) {2.0} | 2 (ND) | 14 (10) | 2 (70) | 1 (ND) |
| 0.2 N | No solid formation | 45 (2.0){0.2} | 10 (12){0.7} | NM | 16 (6.4){1.3} | NM |

*Induction periods in minutes and growth rates in nm/minute. Particle growth data are shown in parentheses, and film growth rate data are shown in braces.
ND = data quality not good enough to determine an acurate rate due to rapid solid formation and aggregation within 1 min
NM = not measured.

In Table 1, the induction period was defined as the time that solid particles (detectable by DLS) appear in the initially clear solution. The initial growth rate was determined by the slope of the linear section of particle size vs. time data (before significant agglomeration occurs). The size was the effective hydrodynamic diameters of solid particles as determined by the DLS.

Figure 11A:
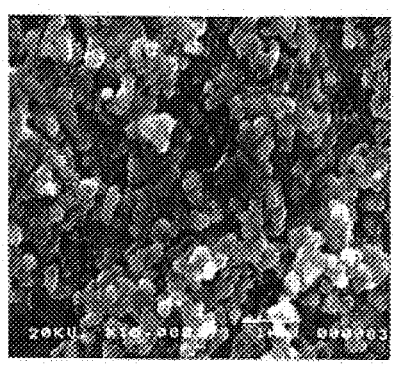
FIG. 11a and FIG. 11b shows the results of an SEM examination of hafnia solid particles from bulk solutions at various incubation times.
Figure 11A:
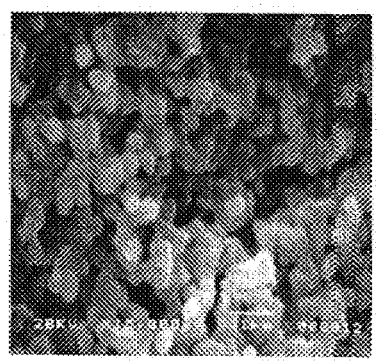
Figure 11A:
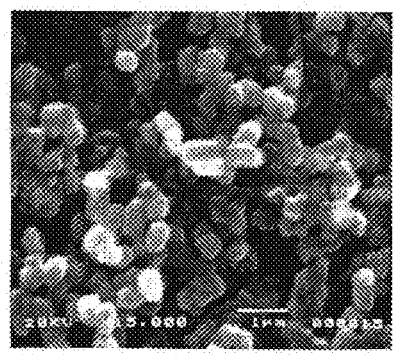
Figure 11A:
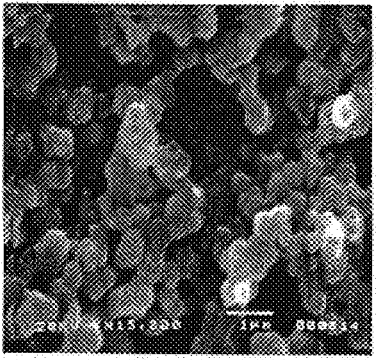
Figure 11B:
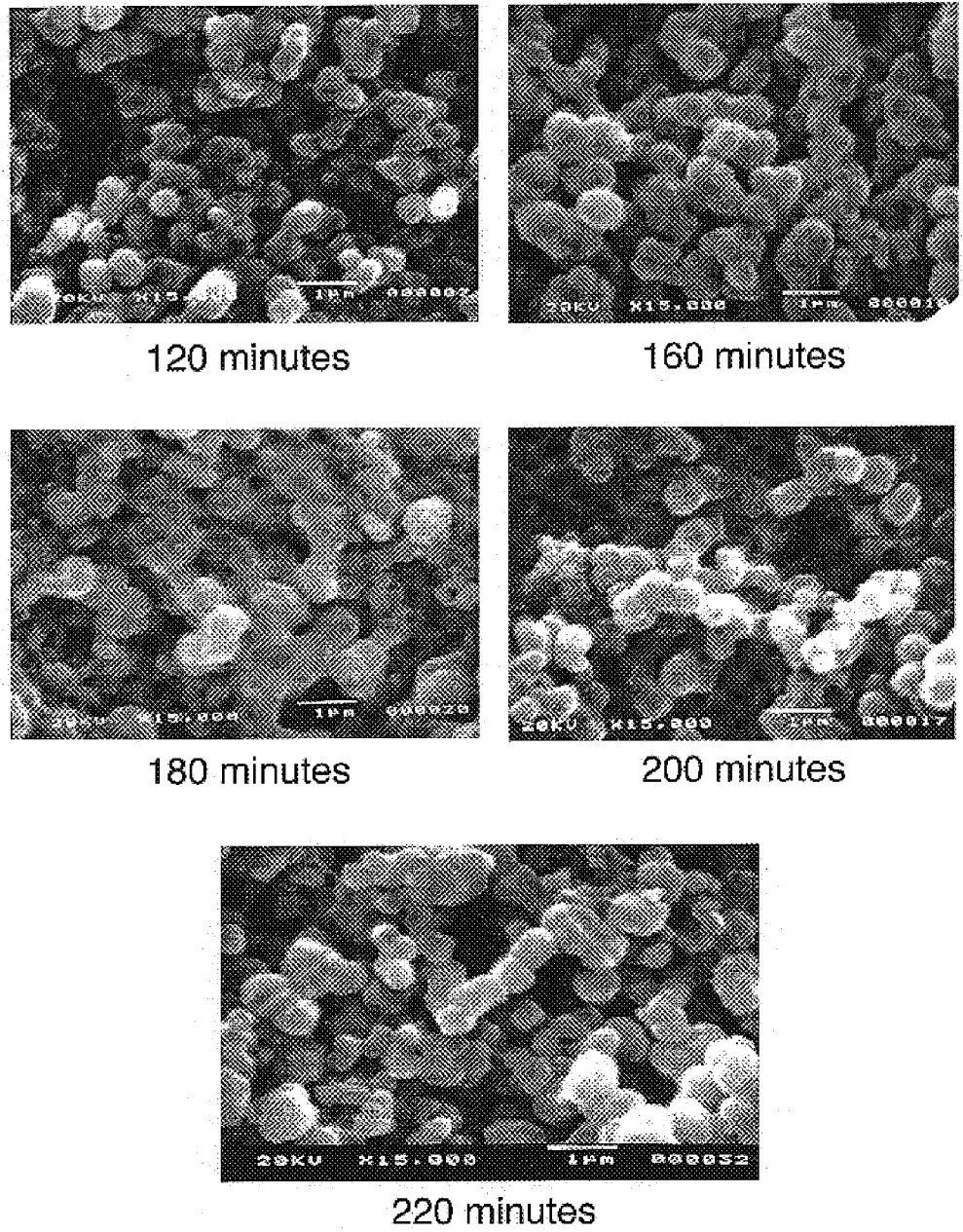
Figure 12:
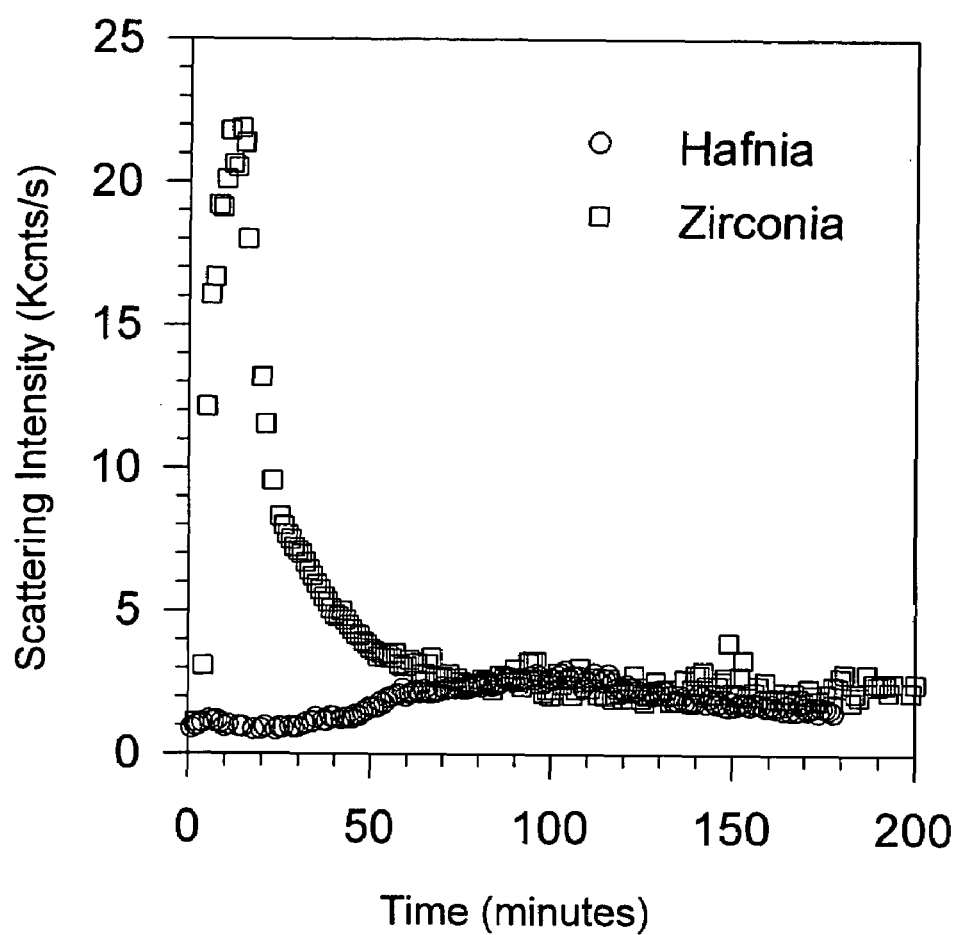
FIG. 12 shows the results of a comparison of hafnia versus zirconia, comparison of their solid formation kinetics in bulk solutions under conditions of 4 mM metal sulfate salt, 80° C., 0.2 N HCl.

For a film-growth condition (80° C., 0.2 N HCl, 4 mM Hf(SO$_4$)$_2$), particle growth and morphology evolution with incubation time were monitored by SEM examination of the collected precipitates (FIG. 11a and FIG. 11b). Before 45 minutes, hafnia precipitation did not occur. All particle samples seem agglomerated. In terms of size, particle size generally increases with increasing incubation time; however, size increase was significant at the early stage. These results are also in agreement with the DLS measurements. Under the conditions used for film deposition, particles in the bulk solutions tend to aggregate and further form loose agglomerates due to fast coagulation.

Synthesis conditions need to satisfy certain criteria to produce optimized film, i.e., reasonably fast film growth kinetics, low film surface roughness, and a final film thickness in the range of 5 to 500 nm. No previous effort has been reported on deposition or growth of hafnia film using a SAM-mediated solution deposition approach.

Solution chemistry and the understanding of hydrolytic condensation processes in solution are important in the controlled formation of solid colloids/particles in solution as well as in the formation of film. For acidic solutions of hafnium sulfate, the following is a schematic description:

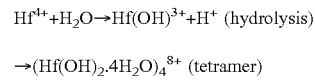

$Hf^{4+} + H_2O \rightarrow Hf(OH)^{3+} + H^+$ (hydrolysis)

$\rightarrow (Hf(OH)_2 \cdot 4H_2O)_4^{8+}$ (tetramer)

In the presence of sulfate anions,

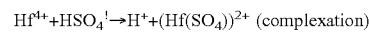

$Hf^{4+} + HSO_4^{1-} \rightarrow H^+ + (Hf(SO_4))^{2+}$ (complexation)

The number of H+ ions from the hydrolysis reaction is negligible because the HCl concentration is two orders of magnitude larger than the Hf(SO$_4$)$_2$ concentration. There is a strong affinity between hafnium and sulfate. The addition of HCl will inhibit both hydrolysis and complexation reactions. Similar to zirconium, hafnium complexes in sulfate solutions may be anionic, polynuclear complexes, $Hf(OH)_n(SO_4)_m{}^{x-}$ or $(Hf_n(OH)_{n+1}(SO_4)_{2n})^{(n+1)-}$. Hydroxyl groups may replace sulfate groups to form anionic species:

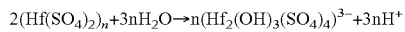

The complexation capability of sulfate may be a significant factor promoting the growth of solids. Further hydrolysis may yield basic sulfate precipitates:

The $Hf(OH)^{3+}$ species and hafnium sulfate oligomers present in solution may undergo polymerization and condensation to yield $HfO_2$.

The formation of solid particles of metal hydrous oxides by forced hydrolysis involves the dehydration of hydrated metal cations, which is accelerated by heating the solutions at moderate temperatures (~<100° C.). In addition, anion sulfate complexation with the hydrated metal cations will change the behavior of hydrolysis and condensation, as well as the characteristics (composition and/or morphology) of the particles precipitated by forced hydrolysis. Ocana et al. reported that the kinetics of hydrous hafnia precipitation is retarded in the presence of sulfate anions. Sulfate in solutions not only strongly complexes with hafnium but also is a potential bridging ligand and promotes polymerization. In addition, it has been demonstrated in the literature that sulfate ions can be incorporated to form basic salts of well-defined stoichiometry or amorphous compounds of varying composition. Therefore, instead of hydrolyzed hafnia, sulfate is incorporated into the films and into the solid particle precipitates in bulk solutions.

Under film deposition conditions used in Applicant's present invention, solutions containing hafnium (IV) cations have a strong tendency to turn cloudy due to hydrolytic precipitate formation. In addition, higher rates of solid formation correspond to higher metal sulfate salt concentration and higher temperatures. An increase in hydrochloric acid (HCl) concentration slows or even inhibits solid particle formation and growth.

It appears that hafnia film formation requires supersaturation conditions, i.e., the product of the concentrations of metal and hydroxyl must exceed the solubility product of the formed solid. Hydrolysis and condensation kinetics of the dissolved hafnium species seem to be proportional to the film growth rate. This is particularly true in the beginning stage of film growth. Process conditions such as higher temperature, higher initial hafnium concentration in solution, and lower HCl concentration clearly correspond to a higher degree of supersaturation and a higher hydrolysis/condensation rate, which in turn, as shown in FIG. 3, leads to a faster film growth rate. It is reasonable to see that higher temperatures (90° C. vs. 80° C.) change only the film growth rate, not the final film thickness (~80 nm in both temperature conditions). When the hafnium sulfate concentration changes from 4 and 10 mM, however, a final thicker film at higher concentration conditions was not seen. Possibly the system has not reached true equilibrium, or the equilibrium film thickness is not sensitive to the initial $Hf(SO_4)_2$ concentration for the range of concentration tested.

Under conditions of rapid formation of solid particles in bulk solutions, reactants (i.e., hafnium ionic species) are depleted quickly. This explains why the film growth rate is faster at the beginning stage and slows down with time (FIG. 3). However, in the presence of significant precipitation in solutions, the increase in final film thickness is not usually proportional to the increase in starting salt concentration. This is because at a higher salt concentration, solid particle growth/aggregation in the bulk solution competes with film deposition for the consumption of solid nanoparticles or nuclei, and more fractions of solid nanoparticles are consumed for the aggregative growth of submicron particles, since nanparticle-nanoparticle interaction is stronger than the nanoparticle-surface (hafnia) interaction. Comparison of FIGS. 3a and 3d also shows that a higher hydrolytic precipitation rate (at a lower acid concentration) may cause faster early-stage film growth but does not guarantee growth of thicker film. Therefore, there should be an optimal condition that controls the hydrolysis/condensation kinetics and solid particle precipitation in solution phase to maximize the fraction of the "reactant" (i.e., metal ions and solid nuclei/nanoparticles) that could be utilized toward increasing film thickness, rather than increasing the solid mass in the bulk solution. In principle, control of the homogeneous precipitation level in solutions also affects the film properties (surface smoothness, nanocluster size in film, uniformity across film, and film density). For example, higher solution hydrolysis kinetics led to smoother film with larger constitutive nanoparticles (FIG. 5d relative to FIG. 5a).

In addition to their role in solution chemistry and solid-forming reactions, substrates can play a crucial role in film formation, either by heterogeneous nucleation/growth of solids on the substrate surface or by attracting (adhering or adsorbing) solid nanoparticles onto the substrate or film surface. Functionalization of the substrate surface with SAMs is a way of inducing heterogeneous nucleation and growth or promoting surface adherence of initial oxide nanoparticle layer on active sites (such as sulfonate $SO_3{}^-$) of the SAM surface and thus enhancing the uniformity of film deposition.

Understanding the film formation and growth mechanisms can assist in tailoring film deposition process conditions (and solution/colloidal chemistry of deposition media) to optimize microstructure or nanostructure in film. There are generally two pathways for film formation or growth: (a) ion-by-ion growth, i.e., heterogeneous nucleation that occurs at the SAM surface or a the surface of oxide film that has already grown, followed by further growth of solid nuclei on the surface; and (b) cluster growth, i.e., first homogeneous nucleation of nanoparticles occurs in the bulk solution phase and then small nanoparticles adhere to the surface of the SAMs and the surface of oxide films. These two mechanisms (simply put, ion deposition or nanocluster deposition) sometimes could occur simultaneously.

The selection of film deposition conditions can govern film formation and growth mechanisms. Generally speaking, the level of supersaturation and the net solution-particle interfacial energy are key parameters in tuning the mechanisms: at low levels of supersaturation, only a few surfaces induce heterogeneous nucleation, while at high levels of supersaturation, nucleation occurs on most surfaces independently of the solution-particle interfacial energy, and growth kinetics are enhanced. The observation of epitaxial growth (i.e., slow, possibly oriented growth of larger particles with larger particle size distribution) typically presents strong evidence for an ion-by-ion mechanism. On the other hand, homogeneous nucleation results in rapid unoriented growth with narrow particle size distributions in films.

Figure 8C:
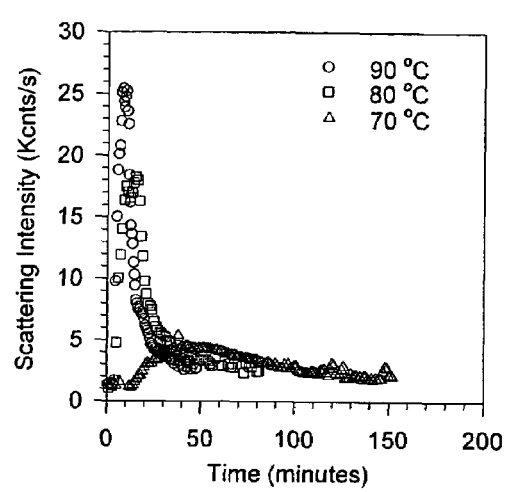
Figure 8C:
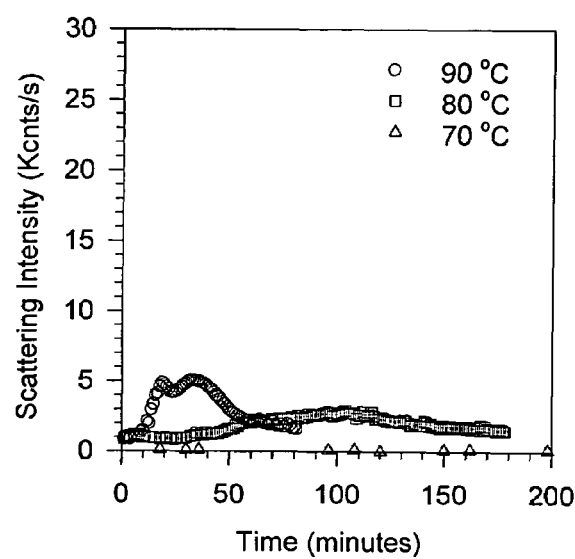

In Applicant's present invention, it is pointed out that the mechanism for initial oxide layer formation on SAM surface may not be the same as the mechanism for the further growth of the film thickness while the oxide surface exposed to the solution. For hafnia systems, Applicant's results seem to support heterogeneous nucleation and growth of the very first layer of hafnia at active sites of the SAM surface. Further, some insight into the hafnia film growth mechanism may be obtained by looking at the film surface morphology (FIG. 2, FIG. 5, and FIG. 6) as well as the film microstructure (FIG. 4), and by correlating Applicant's experimental results between particle growth in solutions (FIG. 7, FIG. 8 and FIG. 10) and film growth on substrate surfaces (FIG. 3). Like zirconia film, the hafnia film show unoriented microstructure (FIG. 4) with a surface morphology of randomly distributed, uniform nanoclusters (FIG. 2, FIG. 5 and FIG. 6). In all cases, faster film growth corresponds to faster particle growth in bulk solutions. There is no film formation until solution turns turbid due to solid particle nucleation. Also, films can still grow when substrates are placed in the turbid solution after the induction period, indicating that gradual nucleation occurs through the whole deposition process. All these observations tend to conclude that in the conditions studied by Applicant, hafnia films grow thicker mainly by a homogeneous nucleation and cluster-growth mechanism.

At a stage after the induction period, the bulk amount of solid colloidal particles (submicrometer-size spheroids and their aggregates, as shown in FIG. 9 and FIG. 11a, 11b) is very different from the constituent nanoparticles in the films (FIG. 2, FIG. 5, and FIG. 6). These observations indicate that at the initial nucleation and growth stage, only nanoparticles of a certain small size (<10 nm) have the affinity to bind to the substrate surface (i.e., the surface of SAM or the surface of already grown oxide film). This observation is in agreement with earlier reported findings that once the diameters of the colloid particles exceed ~10 nm, the forces that would bind them to the growing film become negligibly small. The driving force for film growth, i.e., attractive interactions between the substrate surface and nanoparticles (or nanoclusters) in the bulk solution, could be described by a coagulation model based on the classical DLVO theory which considers a long-range van der Waals interaction force, an electrostatic force, and a short-range Born repulsive force. Nanoparticle size in the film depends on synthesis conditions and is generally larger when there are faster hydrolysis/condensation conditions (i.e., higher salt concentration, higher temperature, lower HCl concentration), see FIG. 6. The large colloidal particles present in the bulk solution at longer reaction times are essentially "inert" (although there is incidental adsorption to the film surface) and thus do not contribute to the growth of the film thickness. Experimental results of zirconia film formation show that after the induction period there is still a continuous evolution or nucleation of the transient, metastable "binding nanoclusters", which can either contribute to the film deposition or be consumed by aggregation toward solid particle formation in the bulk solutions. This is supported by the fact that film deposition/growth still occurred when a wafer was immersed in a turbid heated solution long after the induction period. These binding nanoclusters, although short-lived or unstable due to further growth or aggregation with larger colloids in solution, do have a chance to bind or adhere to the substrate surface. Such nanocluster evolution was eventually depleted in the later stage of a single batch deposition process, which may explain the data of film growth rate decay with time (FIG. 3). This hypothesis on gradual depletion of nucleation is also supported by Applicant's film thickness data (with FIG. 6 showing film surfaces): 82.99 nm (for four 1 hour depositions)>75.71 nm (for two 2-hr depositions)>52.97 nm (for one 4-hr deposition). This means that faster and more nucleation is preferred for a faster and thicker film growth. The initial growth rates of films (FIG. 3 and numbers in braces in Table 1) are almost one order of magnitude less than the initial growth stage of particles in solutions (numbers in parentheses in Table 1). Such discrepancy in growth rates may be explained in the way: film growth may be mainly due to the aggregation (or adherence) between (nanoparticles)$_b$ and (nanoparticles)$_f$, where (nanoparticles)$_b$ refer to the nanoparticles/nuclei in the bulk solutions and (nanoparticles)$_f$ to the nanoparticles that are already on the film surface. On the other hand, Applicant's initial particle size increase vs. time data by DLS may have included not only the contribution from aggregations of primary nanoparticles/nuclei into the sub-micron-sized spheroid particles, but also the ion-by-ion growth of primary nanoparticles and the agglomeration of secondary spheroid particles and their aggregates.

Applicant's experimental data and observation sufficiently support that nanocluster growth (homogeneous nucleation) is dominant mechanism for hafnia film growth because during the period of film growth, it was observed by SAXS and DLS the continued availability of nanoclusters in bulk solutions. The observation of bulk precipitation is a delayed indicator for homogeneous nucleation. However, this does not necessarily exclude the possibility of ion-by-ion growth (heterogeneous nucleation) of nanoclusters/nanoparticles in the already grown film or the continued ion-by-ion growth of the already-adhered particles. The nonporous nature of the films may be attributed in part to the fact that the attached nanoclusters on the substrate surface may continue to grow from the ions in bulk solution and in residual pockets of solution between nanoclusters after attaching in the film. To optimize the film, it is advantageous to select conditions that generate a stable supply of small nanoclusters (typically <10 μm) in solution during film deposition, preventing the possible physisorption (weak bonding) of micron-scale colloids to the film and leading to smoother surfaces and fewer pinhole defects.

Negatively charged metal ionic complexes, such as $(Hf_2(OH)_3(SO_4)_4)^{3-}$, can deposit on the negatively charged surface of deprotonated sulfonate SAM possibly because of chemical bond formation due to ligand exchange, i.e., the sulfonic groups of the SAM may replace sulfates in the nanocluster complexes. A direct influence of the SAM on film deposition (via electrostatic and van der Waals interaction between the SAM and the nanoclusters) would diminish as the film grow thicker.

In a successful biomimetic synthesis of films, heterogeneous nucleation should be promoted and homogeneous nucleation (or particle growth in bulk solution) should be suppressed. Also, it is known that film preparation in a deposition medium with homogeneous nucleation followed by precipitation is disadvantageous because it leads to defects (i.e., physisorbed or trapped large colloids) in the film. Multiple deposition using early-stage solution conditions prevents the formation of relatively large particles in bulk solution and their adsorption on the surface of a growing oxide film. Applicant's multiple deposition experiments have led to a "liquid flow deposition" embodiment, in which the "reactants" (i.e., dissolved metal ions or "binding nanoclusters") of the same age are replenished continuously in a pseudo-steady state, potentially avoiding the depletion of reactants that cause growth to slow down or cease in batch solutions and also avoiding the undesirable formation and physisorption of large particles. It has been suggested by others that the rate of flow of the deposition medium past the substrate can be an additional and easily controlled variable (to match the average residence time with the time needed to nucleate and grow "binding nanoparticles"), besides temperature, acidity, and solution composition.

While there has been shown and described what are at present considered the preferred embodiments of the invention, it will be obvious to those skilled in the art that various changes and modifications can be made therein without departing from the scope of the invention defined by the appended claims.

What is claimed is:

1. A method for fabricating hafnia film comprising the steps of:
   a) providing a substrate having a surface that allows formation of a self-assembled monolayer thereon via covalent bonding;
   b) providing an aqueous solution that provides homogeneous hafnium ionic complexes and hafnium nanoclusters wherein said aqueous solution capable of undergoing homogeneous precipitation under controlled conditions for a desired period of time at a controlled temperature and controlled solution acidity for desired nanocluster nucleation and growth kinetics, desired nanocluster size, desired growth rate of film thickness and desired film surface characteristics;
   c) forming said self-assembled monolayer on said surface of said substrate wherein said self-assembled monolayer comprises a plurality of hydrocarbon chains cross-linked together along said surface of said substrate, said hydrocarbon chains being uniformly spaced from one another and wherein each of said hydrocarbon chains having a functional anchoring group at a first end of said hydrocarbon chain covalently bonded with said surface of said substrate and each of said hydrocarbon chains having a functional terminating group projected away from said surface of said substrate wherein said functional terminating group provides a bonding site for said hafnium film to grow; and
   d) exposing said substrate having said self-assembled monolayer on said surface to said aqueous solution for a desired period of time at a controlled temperature wherein said hafnium ionic complexes and said hafnium nanoclusters are deposited on said bonding site of said functional terminating group of said self-assembled monolayer under controlled conditions for a desired period of time thereby forming said hafnia film wherein the hafnium bonded to said hydrocarbons and to one another provide a uniform ordered arrangement defined by the uniform arrangement of said hydrocarbons.

2. The method of claim 1 wherein said substrate comprises glass, an oxide in solid or particulate form, plastic, silicon wafer or silicon.

3. The method of claim 1 wherein said substrate comprises metal selected from the group consisting of Ge, Al, Si, Ni and Ti or alloy thereof wherein said surface of said substrate includes an oxide.

4. The method of claim 1 wherein said substrate is platinum or gold.

5. The method of claim 1 wherein said substrate is a semiconductor.

6. The method of claim 1 wherein said functional terminating group is OH.

7. The method of claim 1 wherein said functional terminating group is COOH.

8. The method of claim 1 wherein said functional terminating group is $SO_3H$.

9. The method of claim 1 wherein the deposition of said hafnium ionic complexes and said hafnium nanoclusters in said step d) occurs at a temperature below 100° C.

10. The method of claim 1 wherein said functional anchoring group is an end group of a surfactant that forms said self-assembled monolayer is trichlorosilane.

11. The method of claim 1 wherein said functional anchoring group is an end group of a surfactant that forms said self-assembled monolayer is isocyanide, an aromatic thiol or an alkyl thiol.

12. The method of claim 1 wherein the step of exposing said substrate to said aqueous solution is conducted by immersing said substrate having said self-assembled monolayer on said surface into said aqueous solution under controlled conditions for a desired period of time.

13. The method of claim 1 wherein the step of exposing said substrate to said aqueous solution is conducted by continuously flowing said aqueous solution over said self-assembled monolayer on said surface of said substrate under controlled conditions for a desired period of time.

14. The method of claim 1 wherein said aqueous solution comprises hafnium salt.

15. The method of claim 14 wherein said hafnium salt includes hafnium sulfate, hafnium nitrate, hafnium chloride or any other aqueous soluble and hydrolysable salts.

16. The method of claim 1 wherein said step d) occurs under rapid microwave heating.

* * * * *